(12) United States Patent
Watanabe et al.

(10) Patent No.: US 9,647,211 B2
(45) Date of Patent: May 9, 2017

(54) METHOD OF MANUFACTURING INK FOR FORMING FUNCTIONAL LAYER AND METHOD OF MANUFACTURING ORGANIC EL ELEMENT

(71) Applicant: SEIKO EPSON CORPORATION, Tokyo (JP)

(72) Inventors: Shotaro Watanabe, Chino (JP); Yuta Okawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 167 days.

(21) Appl. No.: 14/471,811

(22) Filed: Aug. 28, 2014

(65) Prior Publication Data

US 2015/0064828 A1  Mar. 5, 2015

(30) Foreign Application Priority Data

Sep. 3, 2013  (JP) ................. 2013-181894

(51) Int. Cl.

| | |
|---|---|
| *H01L 21/48* | (2006.01) |
| *H01L 51/00* | (2006.01) |
| *C09K 11/06* | (2006.01) |
| *C09D 11/30* | (2014.01) |
| *C09D 11/50* | (2014.01) |
| *C09D 11/52* | (2014.01) |
| *H01L 51/50* | (2006.01) |

(52) U.S. Cl.
CPC .......... *H01L 51/0007* (2013.01); *C09D 11/30* (2013.01); *C09D 11/50* (2013.01); *C09D 11/52* (2013.01); *C09K 11/06* (2013.01); *H01L 51/5012* (2013.01); *H01L 51/5056* (2013.01); *H01L 51/5088* (2013.01)

(58) Field of Classification Search
None
See application file for complete search history.

(56) References Cited

U.S. PATENT DOCUMENTS

| | | | |
|---|---|---|---|
| 2008/0124570 A1 | 5/2008 | Kondo et al. | |
| 2008/0265214 A1 | 10/2008 | Steiger et al. | |
| 2010/0207105 A1 | 8/2010 | Katakura et al. | |
| 2010/0265307 A1* | 10/2010 | Linton | C09D 7/1275 347/100 |

(Continued)

FOREIGN PATENT DOCUMENTS

| | | |
|---|---|---|
| EP | 1 950 816 A1 | 7/2008 |
| EP | 2 143 769 A1 | 1/2010 |

(Continued)

OTHER PUBLICATIONS

Dec. 3, 2014 Extended European Search Report issued in Application No. 14182757.6.

*Primary Examiner* — Michael Lebentritt
(74) *Attorney, Agent, or Firm* — Oliff PLC

(57) ABSTRACT

A method of manufacturing an ink for forming a functional layer includes: dispersing a mixture in which a low molecular material and a high molecular material are mixed in a poor solvent; and dissolving the mixture by adding a good solvent to the poor solvent in which the mixture is dispersed, in which a volume ratio of the poor solvent is from 10% to 70% with respect to the total volume in which the good solvent is added to the poor solvent and the poor solvent and the good solvent can be mixed.

13 Claims, 18 Drawing Sheets

(56) References Cited

U.S. PATENT DOCUMENTS

2015/0140715 A1* 5/2015 Imamura ................ C09D 11/02
438/46

FOREIGN PATENT DOCUMENTS

| JP | A-08-143708 | 6/1996 |
|----|-------------|--------|
| JP | A-10-298298 | 11/1998 |
| JP | A-2006-190759 | 7/2006 |
| JP | A-2008-226686 | 9/2008 |
| JP | A-2009-245657 | 10/2009 |
| JP | 2012-039083 A | 2/2012 |
| WO | 02/069119 A1 | 9/2002 |
| WO | 2008-146838 A1 | 12/2008 |

* cited by examiner

FIG. 8

[EXAMPLE 1]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE INJECTION LAYER (HIL) | HIGH MOLECULAR | Poly[N,N'-bis(4-butylphenyl)-N,N'-bis(phenyl)-benzidine] | Nonane | 150 | 3-Phenoxytoluene | 272 | 0.02 |
| | | | Decane | 174 | | | 0.02 |
| | | | Undecane | 195 | | | 0.02 |
| | | | Dodecane | 216 | | | 0.02 |
| | LOW MOLECULAR | N,N'-Bis(3-methylphenyl)-N,N'-bis(phenyl)benzidine | Hexanol | 157 | | | 0.02 |
| | | | Heptanol | 177 | | | 0.02 |
| | | | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.06 |
| | | | Diethylene glycol isopropyl methyl ether | 179 | | | 0.06 |
| | | | Diethylene glycol diethyl ether | 188 | | | 0.06 |
| | | | Diethylene glycol butyl methyl ether | 212 | | | 0.06 |
| | | | Diethylene glycol dibutyl ether | 256 | | | 0.06 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.06 |
| | | | Triethylene glycol ethyl methyl ether | 225 | | | 0.06 |
| | | | Triethylene glycol butyl methyl ether | 261 | | | 0.06 |
| | | | Tripropylene glycol dimethyl ether | 215 | | | 0.06 |
| | | | Tetraethylene glycol dimethyl ether | 275 | | | 0.06 |
| | | | 1,3-diisopropylbenzene | 204 | | | 0.10 |
| | | | 1,4-diisopropylbenzene | 210 | | | 0.10 |
| | | | Triisopropylbenzene | 235 | | | 0.02 |
| | | | Pentylbenzene | 205 | | | 0.10 |
| | | | Hexylbenzene | 226 | | | 0.10 |
| | | | Heptylbenzene | 235 | | | 0.06 |
| | | | Octylbenzene | 264 | | | 0.05 |
| | | | Nonylbenzene | 282 | | | 0.03 |

FIG. 9

[EXAMPLE 2]

| FUNCTIONAL LAYER | MATERIAL | | POOR SOLVENT | bp(°C) | GOOD SOLVENT | bp(°C) | DISSOLUTION TIME |
|---|---|---|---|---|---|---|---|
| HOLE INJECTION LAYER (HIL) | HIGH MOLECULAR | Poly[N,N'-bis(4-butylphenyl)-N,N'-bis(phenyl)-benzidine] | Nonane | 150 | 2-Isopropylnaphthalene | 268 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | | | Octanol | 194 | | | 0.02 |
| | | | Nonyl alcohol | 214 | | | 0.02 |
| | | | Decyl alcohol | 233 | | | 0.02 |
| | LOW MOLECULAR | N,N'-Bis(3-methylphenyl)-N,N'-bis(phenyl)benzidine | Dipentyl ether | 186 | | | 0.06 |
| | | | Diethylene glycol dimethyl ether | 162 | | | 0.06 |
| | | | Diethylene glycol ethyl methyl ether | 176 | | | 0.06 |
| | | | Diethylene glycol isopropyl methyl ether | 179 | | | 0.06 |
| | | | Diethylene glycol diethyl ether | 188 | | | 0.06 |
| | | | Diethylene glycol butyl methyl ether | 212 | | | 0.06 |
| | | | Diethylene glycol dibutyl ether | 256 | | | 0.06 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.06 |
| | | | Triethylene glycol ethyl methyl ether | 225 | | | 0.06 |
| | | | Triethylene glycol butyl methyl ether | 261 | | | 0.06 |
| | | | Tripropylene glycol dimethyl ether | 215 | | | 0.06 |
| | | | Tetraethylene glycol dimethyl ether | 275 | | | 0.06 |
| | | | 1,3-diisopropylbenzene | 204 | | | 0.10 |
| | | | 1,4-diisopropylbenzene | 210 | | | 0.10 |
| | | | Triisopropylbenzene | 235 | | | 0.02 |
| | | | Pentylbenzene | 205 | | | 0.10 |
| | | | Hexylbenzene | 226 | | | 0.10 |
| | | | Heptylbenzene | 235 | | | 0.06 |
| | | | Octylbenzene | 264 | | | 0.05 |
| | | | Nonylbenzene | 282 | | | 0.03 |

FIG. 10

[EXAMPLE 3]

| FUNCTIONAL LAYER | MATERIAL | POOR SOLVENT | bp (°C) | GOOD SOLVENT | bp (°C) | DISSOLUTION TIME |
|---|---|---|---|---|---|---|
| HOLE INJECTION LAYER (HIL) | HIGH MOLECULAR Poly[N,N'-bis(4-butylphenyl)-N,N'-bis(phenyl)-benzidine] LOW MOLECULAR N,N'-Bis(3-methylphenyl)-N,N'-bis(phenyl)benzidine | Nonane | 150 | Dibenzyl ether | 298 | 0.02 |
| | | Decane | 174 | | | 0.02 |
| | | Undecane | 195 | | | 0.02 |
| | | Dodecane | 216 | | | 0.02 |
| | | Hexanol | 157 | | | 0.02 |
| | | Heptanol | 177 | | | 0.02 |
| | | Octanol | 194 | | | 0.02 |
| | | Nonyl alcohol | 214 | | | 0.02 |
| | | Decyl alcohol | 233 | | | 0.02 |
| | | Dipentyl ether | 186 | | | 0.06 |
| | | Diethylene glycol dimethyl ether | 162 | | | 0.06 |
| | | Diethylene glycol ethyl methyl ether | 176 | | | 0.06 |
| | | Diethylene glycol isopropyl methyl ether | 179 | | | 0.06 |
| | | Diethylene glycol diethyl ether | 188 | | | 0.06 |
| | | Diethylene glycol butyl methyl ether | 212 | | | 0.06 |
| | | Diethylene glycol dibutyl ether | 256 | | | 0.06 |
| | | Dipropylene glycol dimethyl ether | 171 | | | 0.06 |
| | | Dipropylene glycol methyl propyl ether | 203 | | | 0.06 |
| | | Triethylene glycol dimethyl ether | 216 | | | 0.06 |
| | | Triethylene glycol ethyl methyl ether | 225 | | | 0.06 |
| | | Triethylene glycol butyl methyl ether | 261 | | | 0.06 |
| | | Tripropylene glycol dimethyl ether | 215 | | | 0.06 |
| | | Tetraethylene glycol dimethyl ether | 275 | | | 0.06 |
| | | 1,3-diisopropylbenzene | 204 | | | 0.10 |
| | | 1,4-diisopropylbenzene | 210 | | | 0.10 |
| | | Triisopropylbenzene | 235 | | | 0.02 |
| | | Pentylbenzene | 205 | | | 0.10 |
| | | Hexylbenzene | 226 | | | 0.10 |
| | | Heptylbenzene | 235 | | | 0.06 |
| | | Octylbenzene | 264 | | | 0.05 |
| | | Nonylbenzene | 282 | | | 0.03 |

FIG. 11

[EXAMPLE 4]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE INJECTION LAYER (HIL) | HIGH MOLECULAR | Poly[N,N'-bis(4-butylphenyl)-N,N'-bis(phenyl)-benzidine] | Nonane | 150 | Isopropyl biphenyl | 291 | 0.02 |
| | | | Decane | 174 | | | 0.02 |
| | | | Undecane | 195 | | | 0.02 |
| | | | Dodecane | 216 | | | 0.02 |
| | LOW MOLECULAR | N,N'-Bis(3-methylphenyl)-N,N'-bis(phenyl)benzidine | Hexanol | 157 | | | 0.02 |
| | | | Heptanol | 177 | | | 0.02 |
| | | | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.06 |
| | | | Diethylene glycol isopropyl methyl ether | 179 | | | 0.06 |
| | | | Diethylene glycol diethyl ether | 188 | | | 0.06 |
| | | | Diethylene glycol butyl methyl ether | 212 | | | 0.06 |
| | | | Diethylene glycol dibutyl ether | 256 | | | 0.06 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.06 |
| | | | Triethylene glycol ethyl methyl ether | 225 | | | 0.06 |
| | | | Triethylene glycol butyl methyl ether | 261 | | | 0.06 |
| | | | Tripropylene glycol dimethyl ether | 215 | | | 0.06 |
| | | | Tetraethylene glycol dimethyl ether | 275 | | | 0.06 |
| | | | 1,3-diisopropylbenzene | 204 | | | 0.10 |
| | | | 1,4-diisopropylbenzene | 210 | | | 0.10 |
| | | | Triisopropylbenzene | 235 | | | 0.02 |
| | | | Pentylbenzene | 205 | | | 0.10 |
| | | | Hexylbenzene | 226 | | | 0.10 |
| | | | Heptylbenzene | 235 | | | 0.06 |
| | | | Octylbenzene | 264 | | | 0.05 |
| | | | Nonylbenzene | 282 | | | 0.03 |

FIG. 12

[EXAMPLE 5]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE TRANSPORT LAYER (HTL) | HIGH MOLECULAR | Poly[(9,9-dioctylfluorenyl-2,7-diyl)-co-(4,4'-(N-(4-sec-butylphenyl))diphenylamine)] | Nonane | 150 | 3-Phenoxytoluene | 272 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | 4,4',4''-tris(N,N-phenyl-3-methylphenylamino)triphenylamine | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropyl benzene | 204 | | | 0.30 |
| | | | 1,4-diisopropyl benzene | 210 | | | 0.30 |
| | | | Triisopropyl benzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

FIG. 13

[EXAMPLE 6]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE TRANSPORT LAYER (HTL) | HIGH MOLECULAR | Poly[(9,9-dioctylfluorenyl-2,7-diyl)-co-(4,4'-(N-(4-sec-butylphenyl))diphenylamine)] | Nonane | 150 | 2-Isopropylnaphthalene | 268 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | 4,4',4''-tris(N,N-phenyl-3-methylphenylamino)triphenylamine | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

FIG. 14

[EXAMPLE 7]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE TRANSPORT LAYER (HTL) | HIGH MOLECULAR | Poly[(9,9-dioctylfluorenyl-2,7-diyl)-co-(4,4'-(N-(4-sec-butylphenyl))diphenylamine)] | Nonane | 150 | Dibenzyl ether | 298 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | 4,4',4''-tris(N,N-phenyl-3-methylphenylamino)triphenylamine | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

FIG. 15

[EXAMPLE 8]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| HOLE TRANSPORT LAYER (HTL) | HIGH MOLECULAR | Poly[(9,9-dioctylfluorenyl -2,7-diyl)-co-(4,4'-(N-(4-sec -butylphenyl)) diphenylamine)] | Nonane | 150 | Isopropylbiphenyl | 291 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | 4,4',4''-tris(N,N-phenyl-3 -methylphenylamino) triphenylamine | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

[EXAMPLE 9]

FIG. 16

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| LUMINESCENCE LAYER (EML) | HIGH MOLECULAR | Poly[(9,9-dioctylfluorenyl-2,7-diyl)-co-(N,N'-diphenyl)-N,N'-di(p-butylphenyl)-1,4-diamino-benzene)] | Nonane | 150 | 3-Phenoxytoluene | 272 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | Tris(8-hydroxyquinolato)aluminium(III) | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

FIG. 17

[EXAMPLE 10]

| FUNCTIONAL LAYER | MATERIAL | POOR SOLVENT | bp (°C) | GOOD SOLVENT | bp (°C) | DISSOLUTION TIME |
|---|---|---|---|---|---|---|
| LUMINESCENCE LAYER (EML) | HIGH MOLECULAR Poly[(9,9-dioctylfluorenyl-2,7-diyl)-co-(N,N'-diphenyl)-N,N'-di(p-butylphenyl)-1,4-diamino-benzene)] | Nonane | 150 | 2-Isopropylnaphthalene | 268 | 0.02 |
| | | Decane | 174 | | | 0.02 |
| | | Undecane | 195 | | | 0.02 |
| | | Dodecane | 216 | | | 0.02 |
| | | Hexanol | 157 | | | 0.02 |
| | | Heptanol | 177 | | | 0.02 |
| | | Octanol | 194 | | | 0.02 |
| | | Nonyl alcohol | 214 | | | 0.02 |
| | | Decyl alcohol | 233 | | | 0.02 |
| | | Dipentyl ether | 186 | | | 0.06 |
| | | Diethylene glycol dimethyl ether | 162 | | | 0.06 |
| | | Diethylene glycol ethyl methyl ether | 176 | | | 0.10 |
| | | Diethylene glycol isopropyl methyl ether | 179 | | | 0.20 |
| | | Diethylene glycol diethyl ether | 188 | | | 0.08 |
| | | Diethylene glycol butyl methyl ether | 212 | | | 0.06 |
| | | Diethylene glycol dibutyl ether | 256 | | | 0.04 |
| | | Dipropylene glycol dimethyl ether | 171 | | | 0.06 |
| | | Dipropylene glycol methyl propyl ether | 203 | | | 0.06 |
| | | Triethylene glycol dimethyl ether | 216 | | | 0.08 |
| | | Triethylene glycol ethyl methyl ether | 225 | | | 0.06 |
| | | Triethylene glycol butyl methyl ether | 261 | | | 0.05 |
| | | Tripropylene glycol dimethyl ether | 215 | | | 0.09 |
| | LOW MOLECULAR Tris(8-hydroxyquinolato) aluminium(III) | Tetraethylene glycol dimethyl ether | 275 | | | 0.06 |
| | | 1,3-diisopropylbenzene | 204 | | | 0.30 |
| | | 1,4-diisopropylbenzene | 210 | | | 0.30 |
| | | Triisopropylbenzene | 235 | | | 0.02 |
| | | Pentylbenzene | 205 | | | 0.80 |
| | | Hexylbenzene | 226 | | | 0.80 |
| | | Heptylbenzene | 235 | | | 0.50 |
| | | Octylbenzene | 264 | | | 0.30 |
| | | Nonylbenzene | 282 | | | 0.10 |

FIG. 18

[EXAMPLE 11]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| LUMINESCENCE LAYER (EML) | HIGH MOLECULAR | Poly[(9,9-dioctylfluorenyl -2,7-diyl)-co-(N,N'-diphenyl) -N,N'-di(p-butylphenyl)-1,4 -diamino-benzene)] | Nonane | 150 | Dibenzyl etherl | 298 | 0.02 |
| | | | Decane | 174 | | | 0.02 |
| | | | Undecane | 195 | | | 0.02 |
| | | | Dodecane | 216 | | | 0.02 |
| | | | Hexanol | 157 | | | 0.02 |
| | | | Heptanol | 177 | | | 0.02 |
| | LOW MOLECULAR | Tris(8-hydroxyquinolato) aluminium(III) | Octanol | 194 | | | 0.02 |
| | | | Nonyl alcohol | 214 | | | 0.02 |
| | | | Decyl alcohol | 233 | | | 0.02 |
| | | | Dipentyl ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

FIG. 19

[EXAMPLE 12]

| FUNCTIONAL LAYER | MATERIAL | | POOR SOLVENT | bp (°C) | GOOD SOLVENT | bp (°C) | DISSOLUTION TIME |
|---|---|---|---|---|---|---|---|
| LUMINESCENCE LAYER (EML) | HIGH MOLECULAR | Poly[(9,9-dioctylfluorenyl-2,7-diyl)-co-(N,N'-diphenyl)-N,N'-di(p-butyl)phenyl)-1,4-diamino-benzene)] | Nonane | 150 | Isopropylbiphenyl | 291 | 0.02 |
| | | | Decane | 174 | | | 0.02 |
| | | | Undecane | 195 | | | 0.02 |
| | | | Dodecane | 216 | | | 0.02 |
| | LOW MOLECULAR | Tris(8-hydroxyquinolato) aluminium(III) | Hexanol | 157 | | | 0.02 |
| | | | Heptanol | 177 | | | 0.02 |
| | | | Octanol | 194 | | | 0.02 |
| | | | Nonyl alcohol | 214 | | | 0.02 |
| | | | Decyl alcohol | 233 | | | 0.02 |
| | | | Dipenty ether | 186 | | | 0.06 |
| | | | Diethylene glycol dimethyl ether | 162 | | | 0.06 |
| | | | Diethylene glycol ethyl methyl ether | 176 | | | 0.10 |
| | | | Diethylene glycol isopropyl methyl ether | 179 | | | 0.20 |
| | | | Diethylene glycol diethyl ether | 188 | | | 0.08 |
| | | | Diethylene glycol butyl methyl ether | 212 | | | 0.06 |
| | | | Diethylene glycol dibutyl ether | 256 | | | 0.04 |
| | | | Dipropylene glycol dimethyl ether | 171 | | | 0.06 |
| | | | Dipropylene glycol methyl propyl ether | 203 | | | 0.06 |
| | | | Triethylene glycol dimethyl ether | 216 | | | 0.08 |
| | | | Triethylene glycol ethyl methyl ether | 225 | | | 0.06 |
| | | | Triethylene glycol butyl methyl ether | 261 | | | 0.05 |
| | | | Tripropylene glycol dimethyl ether | 215 | | | 0.09 |
| | | | Tetraethylene glycol dimethyl ether | 275 | | | 0.06 |
| | | | 1,3-diisopropylbenzene | 204 | | | 0.30 |
| | | | 1,4-diisopropylbenzene | 210 | | | 0.30 |
| | | | Triisopropylbenzene | 235 | | | 0.02 |
| | | | Pentylbenzene | 205 | | | 0.80 |
| | | | Hexylbenzene | 226 | | | 0.80 |
| | | | Heptylbenzene | 235 | | | 0.50 |
| | | | Octylbenzene | 264 | | | 0.30 |
| | | | Nonylbenzene | 282 | | | 0.10 |

ABSTRACT
METHOD OF MANUFACTURING INK FOR FORMING FUNCTIONAL LAYER AND METHOD OF MANUFACTURING ORGANIC EL ELEMENT

BACKGROUND

1. Technical Field

The present invention relates to a method of manufacturing an ink for forming a functional layer which is used when a functional layer having a luminescence function is formed and a method of manufacturing an organic EL element.

2. Related Art

An organic electro-luminescence (EL) element as a luminescence element has a functional layer including a luminescence material consisting of an organic compound between an anode and a cathode. As a method of forming such a functional layer, a vapor phase process such as a vacuum deposition method (also referred to as a dry process) and a liquid phase process using a solution in which a functional layer forming material is dissolved or dispersed in a solvent (also referred to as a wet process or a coating process) are known. Generally, a low molecular material is suitably used in the vapor phase process and a high molecular material is used in the liquid phase process from the viewpoint of film forming properties. It is known that the high molecular material is inferior in terms of the luminescent efficiency and the luminescent lifetime in some cases, compared to the low molecular material. On the other hand, since the organic EL element can relatively easily be formed on a large substrate, compared to the vapor phase process, the liquid phase process has been continuously developed.

For example, in JP-A-2006-190759, an organic EL element having a hole injection and transport layer in which a film is formed using a high molecular material by a wet process and a low molecular luminescence layer which is laminated on a hole injection and transport layer and in which a film is formed using a low molecular luminescence material by a wet process is disclosed. As a low molecular luminescence material, an organic compound having an anthracene skeleton or a pyrene skeleton is indicated.

In addition, for example, in JP-A-2008-226686, as a method of manufacturing an organic EL element, a hole injection transport layer is formed by dissolving a triphenylamine-based polymer which is a high molecular material in cyclohexylbenzene as a main solvent and xylene as an auxiliary solvent and then subjecting the resultant to application and drying. In addition, a method of forming a luminescence layer by dissolving a mixture in which a luminescence material which is a low molecular material is doped in a polyolefin-based material which is a high molecular material in a solvent including cyclohexylbenzene and xylene in the same way and then subjecting the resultant to application and drying on a hole injection transport layer is indicated.

Furthermore, for example, in JP-A-2009-245657, as a method of forming a hole injection layer and a hole transport layer, a method of forming a film from a mixed solution of a low molecular layer forming material and a high molecular binder is indicated.

In JP-A-2006-190759, JP-A-2008-226686, and JP-A-2009-245657 described above, in a case where any of the hole injection layer, the hole transport layer, or the luminescence layer consisting of an organic compound among the functional layers having a luminescence function is formed by a liquid phase process, the following organic solvents are indicated as a solvent for dissolving an organic compound of a low molecular material or a high molecular material, or an organic compound which is a mixture of the low molecular material and the high molecular material.

For example, an alcohol-based solvent such as methanol or ethanol, a halogen-based hydrocarbon-based solvent such as dichloromethane or dichloroethane, an aromatic-based solvent such as benzene or toluene, a paraffin-based solvent such as hexane or octane, an ester-based solvent such as ethyl acetate or butyl acetate, an amide-based solvent such as N,N-dimethylformamide or N,N-dimethylacetamide, a ketone-based solvent such as acetone or methyl ethyl ketone, an amine-based solvent such as pyridine or quinoline, a nitrile-based solvent such as acetonitrile or valeronitrile, a sulfur-based solvent such as thiophene or carbon disulfide, and the like are included.

However, depending on a material which is used, the solubility of the low molecular material or the high molecular material with respect to the organic solvent described above is not necessarily big. In particular, in a case where a mixture of the low molecular material and the high molecular material is used, there was a problem in that the low molecular material and the high molecular material may be agglutinated and easily gelled by mutual intermolecular force in the organic solvent, and thus a considerable time (for example, 24 hours or longer) is required until a gel-like mixture to be completely dissolved in the organic solvent, or a gel-like mixture may not be dissolved completely.

SUMMARY

The invention can be realized in the following forms or application examples.

Application Example

According to this application example, there is provided a method of manufacturing an ink for forming a functional layer which is used when a functional layer having a luminescence function is formed, including dispersing a solid content of any of a low molecular material, a high molecular material, or a mixture in which the low molecular material and the high molecular material are mixed, in a poor solvent and dissolving the solid content by adding a good solvent to the poor solvent in which the solid content is dispersed, in which a volume ratio of the poor solvent is from 10% to 70% with respect to the total volume in which the good solvent is added to the poor solvent and the poor solvent and the good solvent can be mixed.

According to this application example, since the good solvent is added to the poor solvent in a state in which the solid content is dispersed, the gelation of the solid content is suppressed in a mixed solvent of the poor solvent and the good solvent. Therefore, it is possible to rapidly dissolve the solid content, compared to a case where the solid content is dissolved only in the good solvent. That is, a method of manufacturing an ink for forming a functional layer in which the solid content can be rapidly dissolved in the mixed solvent can be provided.

In addition, in a case where the ink for forming a functional layer includes the low molecular material and the high molecular material, it is possible to form a functional layer having excellent optical characteristics, compared to a case of not including the low molecular material.

In the method of manufacturing an ink for forming a functional layer according to the application example, the boiling point of the poor solvent is from 150° C. to 300° C. and the boiling point of the good solvent is from 250° C. to 300° C.

According to this method, in a case where the functional layer is formed by a liquid droplet discharging method such as an ink jet method, clogging of a nozzle or the like due to drying of the ink for forming a functional layer hardly occurs and it is possible to manufacture the suitable ink for forming a functional layer with respect to the liquid droplet discharging method.

In the method of manufacturing an ink for forming a functional layer according to the application example, as the poor solvent, at least one kind from among a linear alkane-based solvent, an aliphatic alcohol-based solvent, an aliphatic ether-based solvent, and an aromatic hydrocarbon-based solvent is selected and as the good solvent, at least one kind from among 3-phenoxy toluene, 2-isopropyl naphthalene, dibenzyl ether, and isopropyl biphenyl is selected.

According to this method, it is possible to shorten the dissolution time of the mixture in a mixed solvent by 20% or more, with respect to the dissolution time in a case of dissolving the mixture of the low molecular material and the high molecular material only in the good solvent.

In the method of manufacturing an ink for forming a functional layer according to the application example, as the poor solvent, at least one kind from among a linear alkane-based solvent and an aliphatic alcohol-based solvent is selected and as the good solvent, at least one kind from among 3-phenoxy toluene, 2-isopropyl naphthalene, dibenzyl ether, and isopropyl biphenyl is selected.

According to this method, it is possible to shorten the dissolution time of a mixture in a mixed solvent by $\frac{1}{10}$ or less, with respect to the dissolution time in a case of dissolving the mixture of the low molecular material and the high molecular material only in the good solvent.

In the method of manufacturing an ink for forming a functional layer according to the application example, as the poor solvent, at least one kind from among four kinds of linear alkane-based solvents (nonane, decane, undecane, and dodecane), five kinds of aliphatic alcohol-based solvents (hexanol, heptanol, octanol, nonyl alcohol, and decyl alcohol), fourteen kinds of aliphatic ether-based solvents (dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, and tetraethylene glycol dimethyl ether), and eight kinds of aromatic hydrocarbon-based solvents (1,3-diisopropylbenzene, 1,4-diisopropylbenzene, triisopropylbenzene, pentylbenzene, hexylbenzene, heptylbenzene, octylbenzene, and nonylbenzene) is selected, and as the good solvent, at least one kind from among 3-phenoxy toluene, 2-isopropyl naphthalene, dibenzyl ether, and isopropyl biphenyl is selected.

According to this method, it is possible to provide more suitable ink for forming a functional layer in a case of using the liquid droplet discharging method.

Application Example

According to this application example, there is provided a method of manufacturing an organic EL element provided with a functional layer having a luminescence function between an anode and a cathode, in which the functional layer includes a hole injection layer, a hole transport layer, and a luminescence layer, laminated from the anode side in order, in which the method includes forming at least one layer among the hole injection layer, the hole transport layer, and the luminescence layer using an ink for forming a functional layer including a solid content of any of a low molecular material, a high molecular material, or a mixture in which the low molecular material and the high molecular material are mixed, and in which the ink for forming a functional layer is manufactured by using the method of manufacturing an ink for forming a functional layer according to the application example.

According to the application example, since it is possible to shorten the time required for manufacturing the ink for forming a functional layer, it is possible to provide the method of manufacturing the organic EL element in which the organic EL element can be effectively manufactured in productivity. In addition, in a case where the ink for forming a functional layer includes the low molecular material and the high molecular material, it is possible to form the organic EL element having a functional layer having excellent optical characteristics, compared to a case of not including the low molecular material.

In the method of manufacturing an organic EL element according to the application example, the hole injection layer is formed by using the ink for forming a functional layer in the functional layer forming process.

According to this method, it is possible to effectively form the hole injection layer having excellent hole injection performance.

In the method of manufacturing an organic EL element according to the application example, the hole transport layer is formed by using the ink for forming a functional layer in the functional layer forming process.

According to this method, it is possible to effectively form the hole transport layer having excellent hole transport performance.

In the method of manufacturing an organic EL element according to the application example, the luminescence layer is formed by using the ink for forming a functional layer in the functional layer forming process.

According to this method, it is possible to effectively form the luminescence layer having excellent luminescence performance.

BRIEF DESCRIPTION OF THE DRAWINGS

The invention will be described with reference to the accompanying drawings, wherein like numbers reference like elements.

FIG. 8 is a table showing an evaluation result of a configuration and a dissolution time of an ink for forming a hole injection layer of Example 1.

FIG. 9 is a table showing an evaluation result of a configuration and a dissolution time of an ink for forming a hole injection layer of Example 2.

FIG. 10 is a table showing an evaluation result of a configuration and a dissolution time of an ink for forming a hole injection layer of Example 3.

FIG. 11 is a table showing an evaluation result of a configuration and a dissolution time of an ink for forming a hole injection layer of Example 4.

FIG. 12 is a table showing an evaluation result of a configuration and a dissolution time of an ink for forming a hole transport layer of Example 5.

FIG. 13 is a table showing an evaluation result of a configuration and a dissolution time of an ink for forming a hole transport layer of Example 6.

FIG. 14 is a table showing an evaluation result of a configuration and a dissolution time of an ink for forming a hole transport layer of Example 7.

FIG. 15 is a table showing an evaluation result of a configuration and a dissolution time of an ink for forming a hole transport layer of Example 8.

FIG. 16 is a table showing an evaluation result of a configuration and a dissolution time of an ink for forming a luminescence layer of Example 9.

FIG. 17 is a table showing an evaluation result of a configuration and a dissolution time of an ink for forming a luminescence layer of Example 10.

FIG. 18 is a table showing an evaluation result of a configuration and a dissolution time of an ink for forming a luminescence layer of Example 11.

FIG. 19 is a table showing an evaluation result of a configuration and a dissolution time of an ink for forming a luminescence layer of Example 12.

DESCRIPTION OF EXEMPLARY EMBODIMENTS

Hereinafter, description will be given of an embodiment in which the invention is embodied in accordance with drawings. Moreover, the used drawings are displayed by appropriately enlarging or reducing the size so as to become a state in which parts of description can be recognized.

Moreover, in the following aspects, for example, in a case where "on a substrate" is described, a case of being arranged so as to contact on a substrate, a case of being arranged on a substrate through another component, or a case of being arranged so as to partially contact on a substrate and partially arranged on a substrate through another component is indicated.

Organic EL Apparatus

Figure 1:
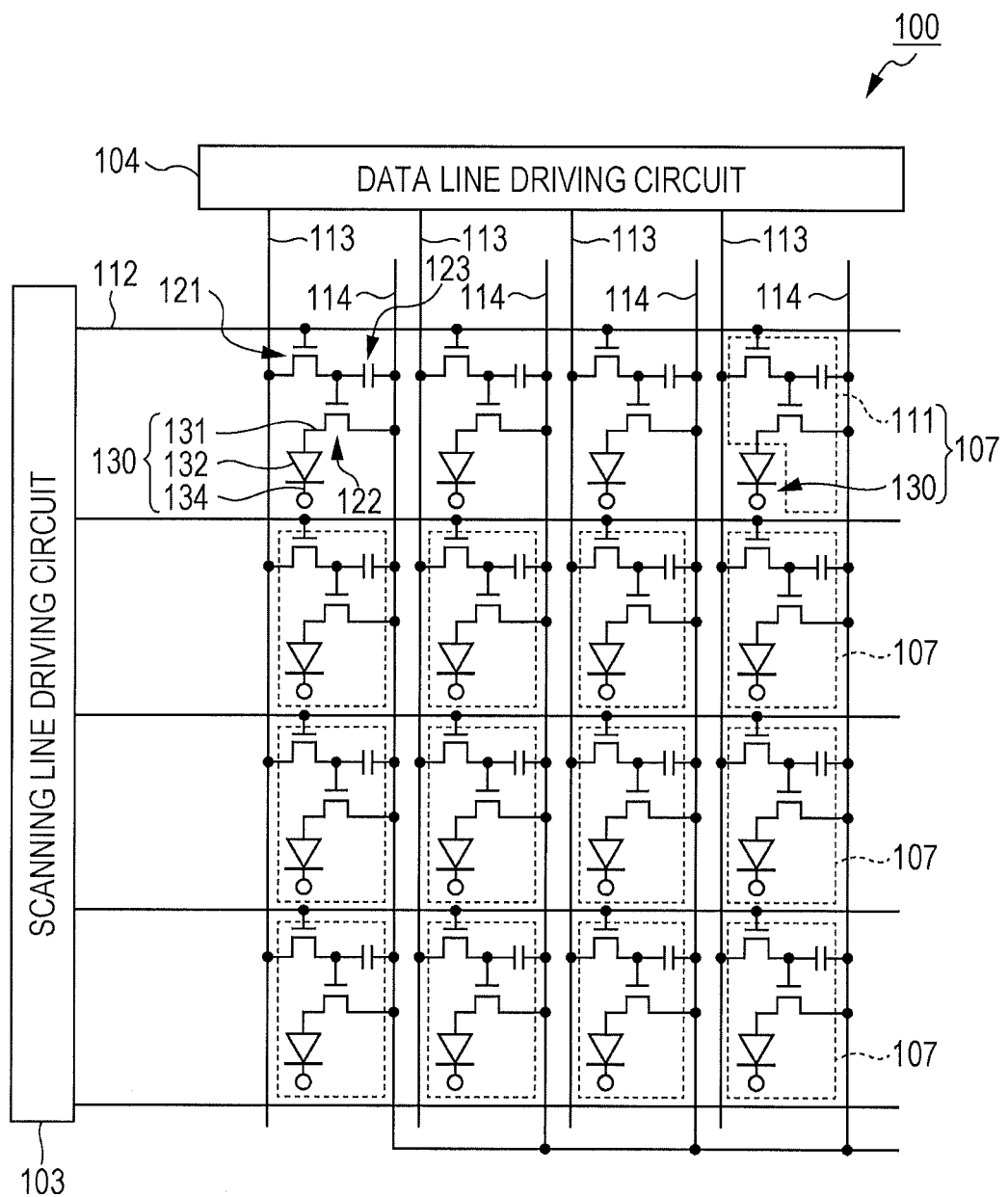
FIG. 1 is an equivalent circuit view showing an electrical configuration of an organic EL apparatus.
Figure 2:
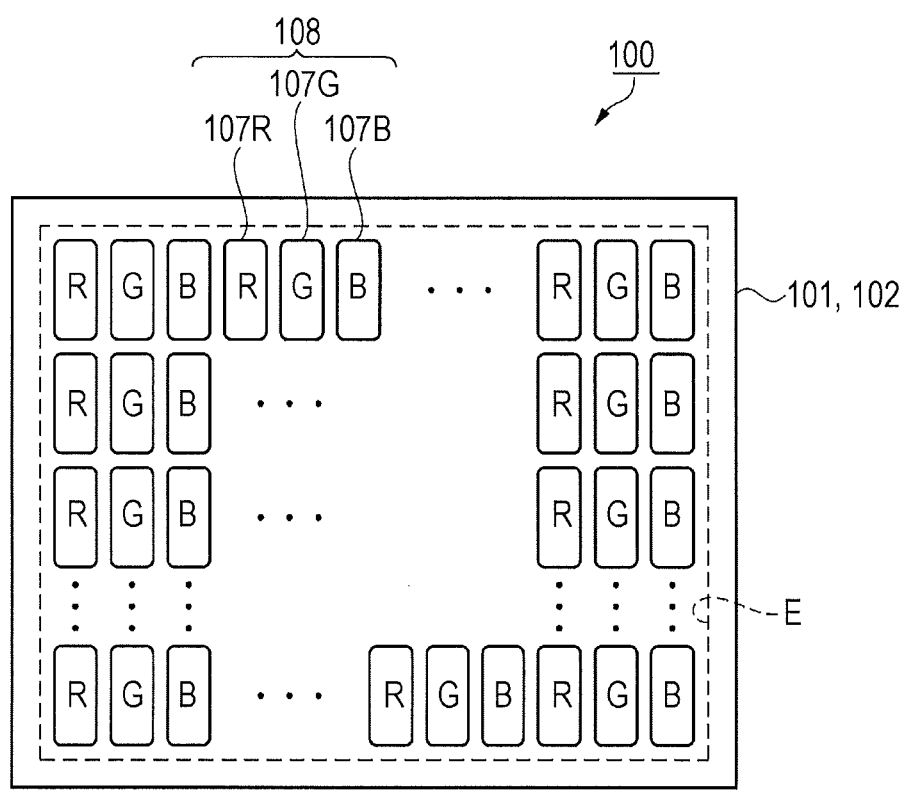
FIG. 2 is a schematic plan view showing a configuration of an organic EL apparatus.
Figure 3:
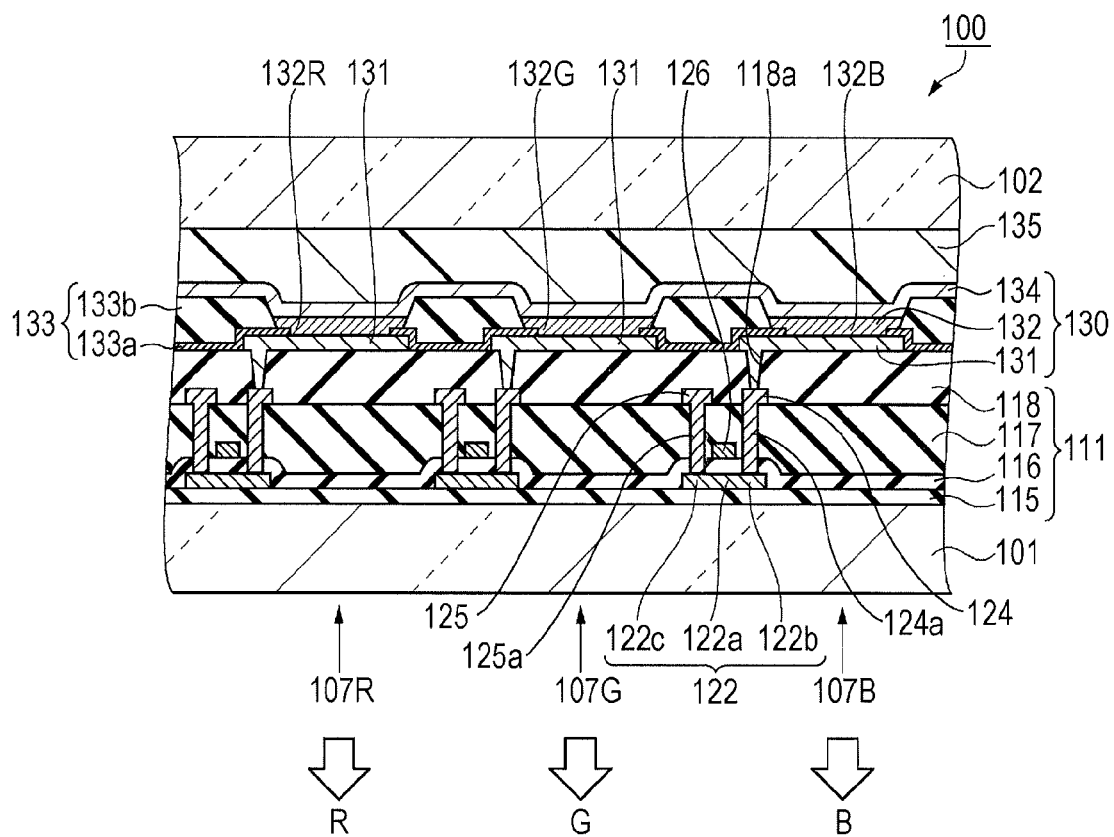
FIG. 3 is a schematic cross-sectional view showing a structure of a pixel of an organic EL apparatus.

First, description will be given of an organic EL apparatus provided with an organic EL element with reference to FIG. 1 to FIG. 3. FIG. 1 is an equivalent circuit view showing an electrical configuration of an organic EL apparatus, FIG. 2 is a schematic plan view showing a configuration of an organic EL apparatus, and FIG. 3 is a schematic cross-sectional view showing a structure of a pixel of an organic EL apparatus.

As shown in FIG. 1, an organic EL apparatus 100 has a plurality of scanning lines 112 and a plurality of data lines 113 which are crossed each other, and power lines 114 in parallel with respect to each of a plurality of data lines 113. The organic EL apparatus 100 has a scanning line driving circuit 103 connected to a plurality of scanning lines 112 and a data line driving circuit 104 connected to a plurality of data lines 113. In addition, the organic EL apparatus 100 has a plurality of luminescence pixels 107 arranged in a matrix state corresponding to each crossing part of a plurality of scanning lines 112 and a plurality of data lines 113.

The luminescence pixel 107 has an organic EL element 130 which is a luminescence element and a pixel circuit 111 controlling driving of the organic EL element 130.

The organic EL element 130 has a pixel electrode 131 as an anode, a counter electrode 134 as a cathode, and a functional layer 132 including a luminescence layer provided between the pixel electrode 131 and the counter electrode 134. Such an organic EL element 130 can be represented as a diode, electrically. Moreover, the counter electrode 134 is formed as a common electrode over a plurality of luminescence pixels 107.

The pixel circuit 111 includes a transistor for a switch 121, a transistor for driving 122, and a storage capacitor 123. Two transistors 121 and 122 can be configured using, for example, an n-channel type or p-channel type thin film transistor (TFT), or a MOS transistor.

A gate of the transistor for a switch 121 is connected to the scanning line 112, one of a source or a drain of the transistor for a switch 121 is connected to the data line 113, and the other of a source or a drain of the transistor for a switch 121 is connected to a gate of the transistor for driving 122.

One of a source or a drain of the transistor for driving 122 is connected to the pixel electrode 131 of the organic EL element 130 and the other of a source or a drain of the transistor for driving 122 is connected to the power line 114. The storage capacitor 123 is connected between the gate of the transistor for driving 122 and the power line 114.

When the scanning line 112 is driven and the transistor for a switch 121 turns to an ON state, a potential based on an image signal supplied from the data line 113 at this time is retained in the storage capacitor 123 through the transistor for a switch 121. An ON and OFF state of the transistor for driving 122 is determined in accordance with a potential of the storage capacitor 123, that is, a gate potential of the transistor for driving 122. Then, when the transistor for driving 122 turns to an ON state, a current having a magnitude in accordance with the gate potential flows from the power line 114 to the functional layer 132 sandwiched between the pixel electrode 131 and the counter electrode 134 through the transistor for driving 122. The organic EL element 130 produces luminescence in accordance with the magnitude of the current flowing through the functional layer 132.

Moreover, the configuration of the pixel circuit 111 is not limited thereto. For example, a transistor for controlling luminescence controlling the conduction between the transistor for driving 122 and the pixel electrode 131 may be provided between the transistor for driving 122 and the pixel electrode 131.

As shown in FIG. 2, the organic EL apparatus 100 has luminescence pixels 107R, 107G, and 107B in which the luminescence of red color (R), green color (G), and blue color (B) (the luminescence color) is obtained. Each of luminescence pixels 107R, 107G, and 107B is in a substantially rectangular shape and is arranged in a matrix state in a display region E. The respective luminescence pixels 107R, 107G, and 107B are provided with the organic EL element 130 in which the luminescence of the corresponding colors is obtained. The luminescence pixels 107 in which the luminescence of the same colors is obtained are arrayed in a vertical direction (in a column direction or in a longitudinal direction of the luminescence pixel 107) on the drawing, and the luminescence pixels 107 of different luminescence colors are arrayed in the order of R, G, and B in a horizontal direction (in a row direction or in a short direction of the luminescence pixel 107) on the drawing. That is, the luminescence pixels 107R, 107G, and 107B of different luminescence colors are arranged in a so-called stripe system.

If such an organic EL apparatus 100 is used as a display apparatus, three luminescence pixels 107R, 107G, and 107B in which different luminescence colors are obtained are set to one display pixel unit 108 and the respective luminescence pixels 107R, 107G, and 107B are electrically controlled. Thereby, a full color display becomes possible.

Moreover, the planar shape and the arrangement of the luminescence pixels 107R, 107G, and 107B of different luminescence colors are not limited thereto, and, for example, may be an array of a delta system or a mosaic system. In addition, the luminescence pixel 107 in which the luminescence of, for example, yellow color (Y) is obtained other than red color (R), green color (G), and blue color (B) may be included without limiting to being provided with the luminescence pixels 107 corresponding to three colors of red color (R), green color (G), and blue color (B).

As shown in FIG. 3, in the organic EL apparatus 100, the organic EL element 130 has the pixel electrode 131 as an anode, a barrier wall 133 dividing the pixel electrode 131, and the functional layer 132 including the luminescence layer formed on the pixel electrode 131. In addition, the organic EL element 130 has the counter electrode 134 as a common electrode formed to oppose the pixel electrode 131 through the functional layer 132.

The barrier wall 133 is configured of a lower layer bank 133a which covers a part of the periphery of the pixel electrode 131, respectively divides a plurality of pixel electrodes 131, and consists of an inorganic insulating material and an upper layer bank 133b which is formed on the lower layer bank 133a and consists of a photosensitive resin material having insulation properties such as a polyfunctional acrylic resin.

The pixel electrode 131 is connected to one of three terminals of the transistor for driving 122 formed on an element substrate 101. A fixed potential, such as, for example, GND is given to the counter electrode 134. By applying a driving potential between the pixel electrode 131 and the counter electrode 134, the holes are injected from the pixel electrode 131 into the functional layer 132 and the electrons are injected from the counter electrode 134 into the functional layer 132. In the luminescence layer included in the functional layer 132, excitons are formed by the holes and the electrons injected, and when the excitons are disappeared (when the electrons and the holes are recombined), a part of the energy is released as fluorescence and phosphorescence. Hereinafter, the functional layers 132 of the organic EL element 130 provided corresponding to the luminescence pixels 107R, 107G, and 107B of red color (R), green color (G), and blue color (B) are also sometimes referred to as the functional layers 132R, 132G, and 132B corresponding to the luminescence colors.

The organic EL apparatus 100 of the embodiment has a bottom emission type structure, and the driving current flows between the pixel electrode 131 and the counter electrode 134 and a light in which the luminescence is produced from the functional layers 132R, 132G, and 132B is reflected by the counter electrode 134 to be taken out from the element substrate 101 side. Therefore, a transparent substrate such as a glass is used as an element substrate 101. In addition, for a sealing substrate 102 arranged opposite to the element substrate 101 through a sealing layer 135, either a transparent substrate or an opaque substrate can be used. As an opaque substrate, for example, a thermosetting resin, a thermoplastic resin, and the like are included, in addition to ceramics such as alumina or one in which a metal sheet such as stainless steel is subjected to an insulation treatment such as surface oxidation.

In the element substrate 101, the pixel circuit 111 driving the organic EL element 130 is provided. That is, a base insulating film 115 composed mainly of, for example, a silicon oxide ($SiO_2$) is formed on the surface of the element substrate 101 and a semiconductor layer 122a of the transistor for driving 122 is formed thereon. The semiconductor layer 122a consists of, for example, polysilicon. A gate insulating film 116 composed mainly of, for example, $SiO_2$ and/or SiN is formed on the surface of the semiconductor layer 122a.

In addition, in the semiconductor layer 122a, a region sandwiching the gate insulating film 116 and overlapping the gate electrode 126 is set to a channel region. Moreover, the gate electrode 126 is electrically connected to the scanning line 112 (not shown). A first interlayer insulating film 117 composed mainly of $SiO_2$ is formed by covering the semiconductor layer 122a and the gate electrode 126.

In addition, in the semiconductor layer 122a, while a low concentration source region and a high concentration source region 122c are provided on the source side of the channel region, a low concentration drain region and a high concentration drain region 122b are provided on the drain side of the channel region, that is, an LDD (Light Doped Drain) structure is formed. Among those, the high concentration source region 122c is connected to a source electrode 125 through a contact hole 125a which is opened over the gate insulating film 116 and the first interlayer insulating film 117. The source electrode 125 is configured as a part of the power line 114 (not shown). On the other hand, the high concentration drain region 122b is connected to a drain electrode 124 provided on the same wiring layer as the source electrode 125 through a contact hole 124a which is opened over the gate insulating film 116 and the first interlayer insulating film 117.

A second interlayer insulating film 118 is formed on the upper layer of the first interlayer insulating film 117 on which the source electrode 125 and the drain electrode 124 are formed. The second interlayer insulating film 118 is formed in order to eliminate the unevenness on the surface due to the transistor for driving 122 or the like configuring the pixel circuit 111, the source electrode 125, the drain electrode 124, or the like, is configured mainly of $SiO_2$ in the same way as the first interlayer insulating film 117, and is subjected to a flattening treatment such as CMP (Chemical Mechanical Polishing).

Then, the pixel electrode 131 is formed on the surface of the second interlayer insulating film 118 and is connected to the drain electrode 124 through the contact hole 118a provided on the second interlayer insulating film 118. That is, the pixel electrode 131 is connected to the high concentration drain region 122b of the semiconductor layer 122a through the drain electrode 124. The counter electrode 134 is connected to GND. Therefore, the driving current which is supplied from the power line 114 described above to the pixel electrode 131 and flows between the pixel electrode 131 and the counter electrode 134 is controlled by the transistor for driving 122. Thereby, the pixel circuit 111 makes the desired organic EL element 130 produce luminescence and a color display becomes possible.

The respective functional layers 132R, 132G, and 132B consist of a plurality of thin film layers including the hole injection layer, the hole transport layer, and the luminescence layer and the hole injection layer, the hole transport layer, and the luminescence layer are laminated thereon in this order from the pixel electrode 131 side. In the embodiment, the hole injection layer, the hole transport layer, and the luminescence layer are film-formed using the liquid droplet discharging method (the ink jet method). A detailed configuration of the functional layer 132 will be described below, however, at least one thin film layer among the hole injection layer, the hole transport layer, and the luminescence layer includes the low molecular material and the high molecular material. In the embodiment, the low molecular material indicates a monomer having a molecular weight of 10,000 or less and the high molecular material indicates a polymer having a weight average molecular weight of 10,000 or more.

The element substrate 101 having such an organic EL element 130 is fully sealed by the sealing substrate 102 without any space through the sealing layer 135 using a thermosetting type epoxy resin or the like as a sealing member.

The organic EL element 130 of the embodiment is manufactured by using a method of manufacturing described below, and since the hole injection layer, the hole transport layer, and luminescence layer have respectively substantially constant film thicknesses and stable film shapes (cross sectional shapes), the desired luminescent efficiencies and luminescent lifetimes are respectively obtained in the functional layers 132R, 132G, and 132B in which the different luminescence colors are obtained.

Moreover, the organic EL apparatus 100 provided with the organic EL element 130 of the embodiment is not limited to bottom emission type, and, for example, may have a top emission type structure in which the pixel electrode 131 is formed using a conductive material having light reflectivity, the counter electrode 134 as a cathode is formed using a transparent conductive material, and the luminescence from the organic EL element 130 is reflected by the pixel electrode 131 to be taken out from the sealing substrate 102 side. In addition, in a case of having top emission type, the organic EL apparatus 100 may also have a configuration in which color filters corresponding to the luminescence colors of the organic EL element 130 are provided corresponding to each organic EL element 130. Furthermore, in a case where the organic EL apparatus 100 has a color filter, the organic EL apparatus 100 may also have a configuration in which a white luminescence is obtained from the organic EL element 130.

Figure 4:
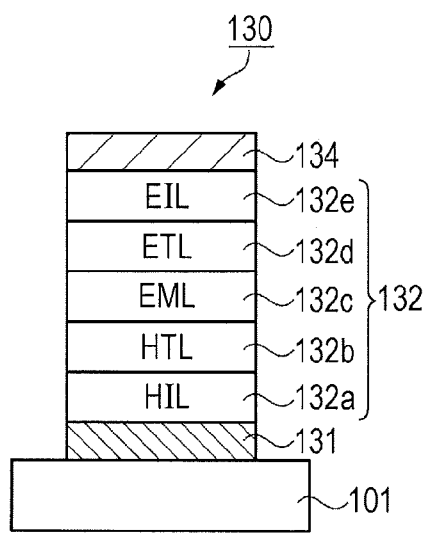
FIG. 4 is a typical cross-sectional view showing a configuration of an organic EL element.

Next, description will be given of a configuration of the organic EL element 130 with reference to FIG. 4. FIG. 4 is a typical cross-sectional view showing a configuration of an organic EL element.

As shown in FIG. 4, the organic EL element 130 has the pixel electrode 131 formed on the element substrate 101 as an anode, the counter electrode 134 arranged opposite to the pixel electrode 131 as a cathode, and the functional layer 132 sandwiched between the pixel electrode 131 and counter electrode 134. The functional layer 132 includes a hole injection layer 132a, a hole transport layer 132b, a luminescence layer 132c, an electron transport layer 132d, and an electron injection layer 132e which are laminated from the pixel electrode 131 side in order. Hereinafter, detailed description will be given of each configuration of the organic EL element 130.

Pixel Electrode

The pixel electrode 131 is an electrode for injecting the holes into the functional layer 132, and it is preferable to use a transparent electrode material having a big work function and excellent conductivity. As a transparent electrode material, for example, a metallic oxide such as ITO (Indium Tin Oxide), IZO (Indium Zinc Oxide), $In_2O_3$, $SnO_2$, fluorine-added $SnO_2$, Sb-added $SnO_2$, ZnO, Al-added ZnO, or Ga-added ZnO, Au, Pt, Ag, and Cu or an alloy including these, and the like are included. In addition, these can also be used in combination of two or more kinds thereof. After a film is formed using these transparent electrode materials by deposition or various sputterings (RF magnetron sputtering), a pattern formation is performed by a photolithography method. The thickness of the pixel electrode 131 is not particularly limited, however, is preferably from approximately 10 nm to 200 nm and more preferably from approximately 30 nm to 150 nm.

Hole Injection Layer

The hole injection layer 132a has a function of facilitating an injection of the holes from the pixel electrode 131. As a material of such a hole injection layer 132a, an ion conductive hole injection material in which an electron-accepting dopant is added to a conductive high molecular material (or a conductive oligomer material) is suitably used so that the hole injection layer 132a can be formed by using the liquid phase process. As such an ion conductive hole injection material, for example, a polythiophone-based hole injection material such as poly(3,4-ethylenedioxythiophene)-poly(styrene sulfonate) (PEDOT/PSS) or a polyaniline-based hole injection material such as polyaniline-poly(styrene sulfonate) (PANI/PSS) can be used. These hole injection materials are applied by using the liquid phase process such as a liquid droplet discharging method (an ink jet method or the like) or a screen printing. After application, a film formation is performed by drying and firing. The thickness of such a hole injection layer 132a is not particularly limited, however, is preferably from approximately 5 nm to 150 nm and more preferably from approximately 10 nm to 100 nm.

Moreover, the hole injection layer 132a can also be omitted depending on a combination of the kind of a constituent material of the pixel electrode 131, the hole transport layer 132b, and the luminescence layer 132c configuring the organic EL element 130, the thickness thereof, or the like.

Hole Transport Layer

The hole transport layer 132b is provided between the hole injection layer 132a and the luminescence layer 132c, in order to improve transport properties (injection properties) of the holes to the luminescence layer 132c and suppress the entering of the electrons from the luminescence layer 132c into the hole injection layer 132a. That is, the hole transport layer 132b is for improving the luminescent efficiency due to the combination of the holes and the electrons in the luminescence layer 132c. In the embodiment, the hole transport layer 132b includes a hole transport material which is the low molecular material and the high molecular material. The hole transport material is not particularly limited, however, an amine compound can be used. For example, TPD (N,N'-diphenyl-N,N'-bis(3-methylphenyl)-1,1'-biphenyl-4,4'-diamine), α-NPD (N,N'-diphenyl-N,N'-bis(1-naphthyl)-1,1'-biphenyl-4,4'-diamine), m-MTDATA (4,4',4"-tris(N-3-methylphenyl-N-phenylamino)triphenylamine), 2-TNATA (4,4',4"-tris(N,N-(2-naphthyl)phenylamino)triphenylamine), TCTA (tris-(4-carbazoyl-9-yl-phenyl)-amine, or the like can be used.

As the high molecular material, a polyparaphenylenevinylene derivative, a polyfluorene derivative, a polyaniline derivative, a polyvinyl carbazole derivative, a polythiophene derivative, polyethylene terephthalate (PET), polyethylene naphthalate (PEN), polyethylene sulfone (PES), polyolefin (PO), polyimide (PI), polyethylene, polypropylene, cellulose esters such as cellophane, cellulose diacetylate, cellulose triacetate, cellulose acetate butyrate, cellulose acetate propionate, cellulose acetate phthalate, or cellulose nitrate and a derivative thereof, polyvinylidene chloride, polyvinyl alcohol, polyethylene vinyl alcohol, syndiotactic polystyrene, polycarbonate, polymethyl pentene, polyether ketone, polyether sulfone, polysulfones, polyether ketone imide, polyamide, nylon, polymethylmethacrylate (PMMA), acryl, polyarylate, an organic-inorganic hybrid resin, or the like can be used.

As to a mixture of the low molecular material and the high molecular material, it is possible to use in a range in which a mixed ratio of the low molecular material is from 0.1 wt % to 99.9 wt % as a weight ratio.

A mixture including these hole transport materials (the low molecular materials) and the high molecular material are also applied by using the liquid phase process such as a liquid droplet discharging method (an ink jet method) or a screen printing. After application, a film formation is performed by drying and firing. In the embodiment, since the liquid droplet discharging method (the ink jet method) as a liquid phase process is used, the weight average molecular weight of the high molecular material is preferably from 10,000 to 300,000.

In addition, though described later in details, in the embodiment, firstly, the mixture (the hole transport layer forming material) in which the low molecular material and the high molecular material are mixed is dispersed in a poor solvent, afterward, a good solvent is added thereto, and the mixture is dissolved in a mixed solvent of the poor solvent and the good solvent to produce an ink for forming a functional layer (an ink for forming a hole transport layer). Thereby, it is possible to suppress the agglutination and gelation of the low molecular material and the high molecular material by mutual intermolecular force and rapidly dissolve the mixture in the mixed solvent, compared to a case of dissolving the mixture only in the good solvent. When such an ink for forming a functional layer (an ink for forming a hole transport layer) is used, since the mixture is sufficiently dissolved and the gel-like mixture is not included, it is possible to stably form a film by the liquid droplet discharging method (the ink jet method). The thickness of the hole transport layer 132b is not particularly limited, however, is preferably from approximately 5 nm to 100 nm and more preferably from approximately 10 nm to 50 nm.

Luminescence Layer

A material of the luminescence layer is not particularly limited, however, for example, it is preferable to include a luminescence material (a guest material) in which the luminescence of red color, green color, and blue color can be obtained and a host material in which a recombination of the injected holes and electrons can effectively be promoted.

As a guest material, for example, a phosphorescence material such as Ir(ppy)3 (fac-tris(2-phenylpyridine) iridium), Ppy2Ir(acac) (bis(2-phenyl-pyridinate-N,C2) iridium(acetylacetonate)), Bt2Ir(acac) (bis(2-phenylbenzothiazolate-N,C2')iridium(III)(acetylacetonate)), Btp2Ir (acac) (bis(2,2'-benzothienyl)-pyridinate-N,C3)iridium (acetylacetonate), Flrpic (iridium-bis(4,6-difluorophenyl-pyridinate-N,C.2.)-picolinate), Ir(pmb)3 (iridium-tris(1-phenyl-3-methyl benzimidazoline-2-pyridine-C,C(2)')), FIrN4 (((iridium(III)-bis(4,6-difluoro phenylpyridinate)(5-(pyridin-2-yl)-tetrazolate)), Firtaz ((iridium(III)-bis(4,6-difluorophenyl pyridinate)(5-(pyridin-2-yl)-1,2,4-triazolate)), or PtOEP (2,3,7,8,12,13,17,18-octaethyl-21H,23H-porphyrin, platinum (II)) or a fluorescence material such as $Alq_3$ (8-hydroxyquinolinate)aluminium, rubrene, perylene, 9,10- diphenyl anthracene, tetraphenyl butadiene, Nile Red, Coumarin 6, or Quinacridone can be used.

As a host material, for example, CBP (4,4'-bis(9-dicarbazoyl)-2,2'-biphenyl), BAlq (bis-(2-methyl-8-quinolinolate)-4-(phenylphenolate)aluminium), mCP (N,N-dicarbazolyl-3,5-benzene: a CBP derivative), CDBP (4,4'-bis(9-carbazolyl)-2,2'-dimethyl-biphenyl), DCB (N,N'-dicarbazolyl-1,4-dimethene-benzene), P06 (2,7-bis (diphenylphosphine oxide)-9,9-dimethylfluorene), SimCP (3,5-bis(9-carbazoyl)tetraphenyl silane), UGH3 (w-bis(triphenyl silyl)benzene), or the like can be used.

If such a guest material and a host material are used, the luminescence layer 132c can be formed by not only the liquid phase process but also the vapor phase process. The thickness of the luminescence layer 132c is not particularly limited, however, is preferably from approximately 5 nm to 100 nm.

Electron Transport Layer

The electron transport layer 132d has a function of transporting the electrons which are injected from the counter electrode 134 into the electron transport layer 132d to the luminescence layer 132c. In addition, the electron transport layer 132d has a function of blocking the holes passing through from the luminescence layer 132c to the electron transport layer 132d in some cases. A material of such an electron transport layer 132d is not particularly limited, however, for example, a quinoline derivative such as an organic metal complex having 8-quinolinol such as tris(8-quinolinolato)aluminium ($Alq_3$) or 8-quinolinolato lithium (Liq) or a derivative thereof as a ligand, an oxadiazole derivative such as 2-(4-tert-butylphenyl)-5-(4-biphenyl)-1,3,4-oxadiazole (tBu-PBD) or 2,5-bis(1-naphthyl)-1,3,4-oxadiazole (BND), a silole derivative, a pyridine derivative, a pyrimidine derivative, a quinoxaline derivative, an imidazole derivative, or the like is suitably used so as to be able to form the electron transport layer 132d by using the vapor phase process. In addition, these materials can be used in a combination of two or more kinds thereof.

The thickness of the electron transport layer 132d is not particularly limited, however, is preferably from approximately 1 nm to 100 nm and more preferably from approximately 5 nm to 50 nm.

Electron Injection Layer

The electron injection layer 132e has a function of improving an injection efficiency of the electrons from the counter electrode 134 into the electron transport layer 132d. A material of such an the electron injection layer 132e is not particularly limited, however, for example, an alkali metal, an alkaline earth metal, a rare earth metal, an alkali metal salt (oxide, fluoride, chloride, or the like), an alkaline earth metal salt (oxide, fluoride, chloride, or the like), or a rare earth metal salt (oxide, fluoride, chloride, or the like) can be used so as to be able to form the electron injection layer 132e by using the vapor phase process. The thickness of the electron injection layer 132e is not particularly limited, however, is preferably from approximately 0.01 nm to 100 nm and more preferably from approximately 0.1 nm to 10 nm.

Moreover, the functional layer 132 is not limited to the configuration described above and may include an organic layer or an inorganic layer for controlling a flow of the carriers (the holes or the electrons).

Counter Electrode

The counter electrode 134 is an electrode for injecting the electrons into the functional layer 132 and it is preferable to use a material having a small work function. In addition, for example, Li, Mg, Ca, Sr, La, Ce, Er, Eu, Sc, Y, Yb, Ag, Cu, Al, Cs, Rb, or Au or an alloy including these, or the like is used so as to be able to form the counter electrode 134 by using the vapor phase process in a cathode forming process described below. In addition, these materials can also be used in a combination of two or more kinds thereof (for example, a laminated body having a plurality of layers or the like). The thickness of the counter electrode 134 is not particularly limited, however, for example, is from 100 nm to 1,000 nm.

Moreover, the functional layer 132 in the organic EL element 130 may include the hole injection layer 132a, the hole transport layer 132b, and the luminescence layer 132c, and in order to improve the luminescent efficiency and the luminescent lifetime, for example, an intermediate layer for improving injection properties or transport properties of the holes or the electrons as a carrier or preventing the holes or the electrons from being leaked to parts other than the luminescence layer 132c may be included.

Figure 5:
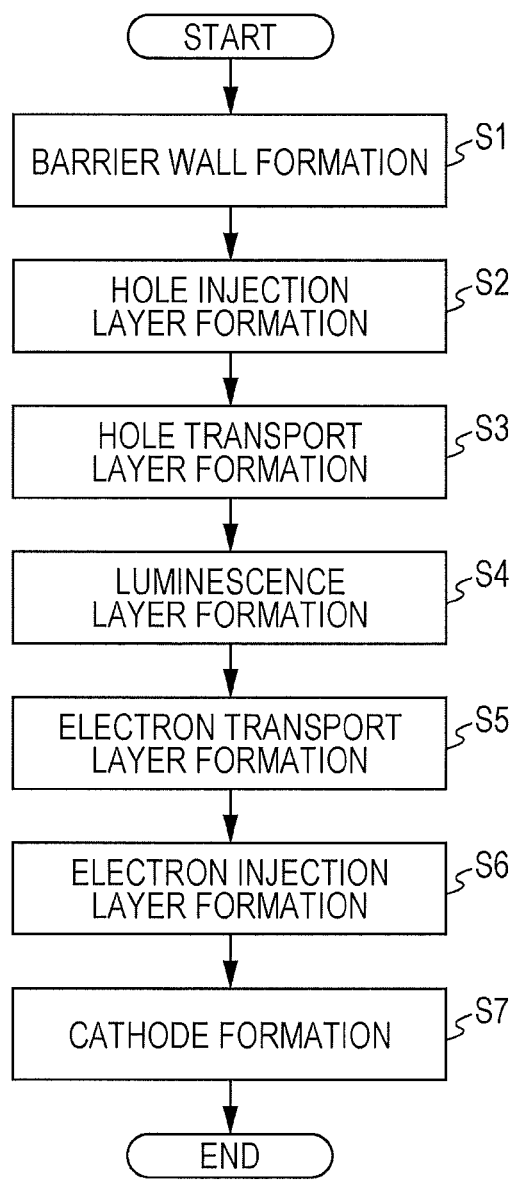
FIG. 5 is a flow chart showing a method of manufacturing an organic EL element.

Next, more specifically, description will be given of a method of manufacturing the organic EL element 130 with reference to FIG. 5 to FIG. 7C. FIG. 5 is a flow chart showing a method of manufacturing an organic EL element and FIGS. 6A to 6E and FIGS. 7A to 7C are schematic cross-sectional views showing a method of manufacturing an organic EL element. Moreover, hereinafter, as a description of a method of manufacturing the organic EL element 130, description will be given of processes after the pixel electrode 131 is formed in order. In addition, the pixel electrode 131 provided on the element substrate 101, the pixel circuit 111 connecting to the pixel electrode 131, and the like can be formed by using a well-known method as described above.

As shown in FIG. 5, a method of manufacturing the organic EL element 130 of the embodiment has a barrier wall forming process (Step S1), a hole injection layer forming process (Step S2), a hole transport layer forming process (Step S3), a luminescence layer forming process (Step S4), an electron transport layer forming process (Step S5), an electron injection layer forming process (Step S6), and a cathode forming process (Step S7).

Figure 6A:
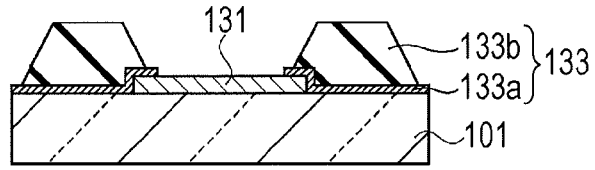
FIGS. 6A to 6E are schematic cross-sectional views showing a method of manufacturing an organic EL element.

In Step S1 in FIG. 5, a lower layer bank 133a is firstly formed so as to cover an outer edge of the pixel electrode 131 and divide the pixel electrode 131, as shown in FIG. 6A. As a method of forming the lower layer bank 133a, for example, the film is formed using silicon oxide which is an inorganic insulating material over the entire surface of the element substrate 101 on which the pixel electrode 131 is formed by the vapor phase process such as a deposition method or a sputtering method. Then, a method of patterning the formed inorganic insulating film by a photolithography method so that the surface of the pixel electrode 131 is exposed is included. The thickness of the lower layer bank 133a is from approximately 100 nm to 200 nm. Next, the upper layer bank 133b is formed on the lower layer bank 133a. As a method of forming the upper layer bank 133b, for example, the upper layer bank 133b is formed on the lower layer bank 133a, a photosensitive resin layer is formed by applying a photosensitive resin material having insulation properties such as a polyfunctional acrylic resin onto the surface of the element substrate 101 on which the lower layer bank 133a is formed with a thickness of from approximately 1 μm to 3 μm and then drying. As a method of applying the photosensitive resin material, a transfer method, a slit coat method, and the like are included. Then, the upper layer bank 133b having the cross section surface in a trapezoidal shape is formed by exposing the photosensitive resin layer using a mask for exposure corresponding to the shape of the luminescence pixel 107 (refer to FIG. 2) and then developing. The upper layer bank 133b is formed so that a part of the lower layer bank 133a covering the outer edge of the pixel electrode 131 is exposed.

In addition, the element substrate 101 is subjected to the surface treatment so that the surface of the pixel electrode 131 and a part of the exposed lower layer bank 133a exhibit suitable lyophilicity with respect to the ink for forming a functional layer as a solution including the functional layer forming material described below and the surface of the upper layer bank 133b similarly exhibits liquid repellency with respect to the ink for forming a functional layer. Specifically, firstly, the element substrate 101 is subjected to a plasma treatment using an oxygen ($O_2$) gas as a treatment gas and the surface of the pixel electrode 131 and the part of the exposed lower layer bank 133a are made to be lyophilicity. Subsequently, the element substrate 101 is subjected to a plasma treatment using a fluorine-based treatment gas such as, for example, $CF_4$ and the surface of the upper layer bank 133b is made to be liquid repellency. Moreover, the upper layer bank 133b may be formed by applying the photosensitive resin material including a liquid repellent material such as a fluorine-based compound. In a case of using the photosensitive resin material including the liquid repellent material, it is preferable that the element substrate 101 be subjected to a UV ozone treatment in order to remove a residue on the pixel electrode 131 after the upper layer bank 133b is formed. Hereinafter, a region including the pixel electrode 131 divided by the barrier wall 133 is referred as a film forming region. Then, processing goes to Step S2.

Figure 6B:
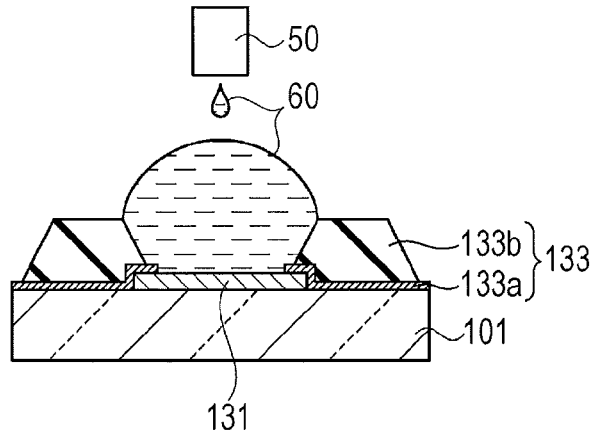
Figure 6C:
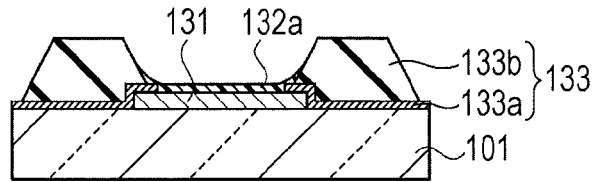

In Step S2 in FIG. 5, the hole injection layer 132a is formed by the liquid phase process. Specifically, firstly, an ink for forming a functional layer 60 which is a solution including the hole injection material described above and, for example, water as a solvent is, for example, discharged to the film forming region from a nozzle of an ink jet head 50, as shown in FIG. 6B. It is possible to accurately discharge the ink for forming a functional layer 60 with the predetermined amount as a liquid droplet to the film forming region by using the ink jet head 50. The discharged ink for forming a functional layer 60 is wetly spread on the surface of the pixel electrode 131 which is made to be lyophilicity and is raised by the interfacial surface tension in the film forming region surrounded by the barrier wall 133 which is made to be liquid repellency. By heating and drying the element substrate 101 on which the ink for forming a functional layer 60 is applied, for example, under an air atmosphere, the hole injection layer 132a is formed on the pixel electrode 131, as shown in FIG. 6C. Since the surface of the pixel electrode 131 and the part of the lower layer bank 133a which are exposed have been made to be lyophilicity, the hole injection layer 132a is formed without unevenness in the film forming region. Moreover, in the embodiment, although the hole injection layer 132a consisting of the same material is formed in each film forming region on the element substrate 101, the material of the hole injection layer 132a may be changed depending on the luminescence colors corresponding to the luminescence layer 132c which is formed later. Then, processing goes to Step S3.

Figure 6D:
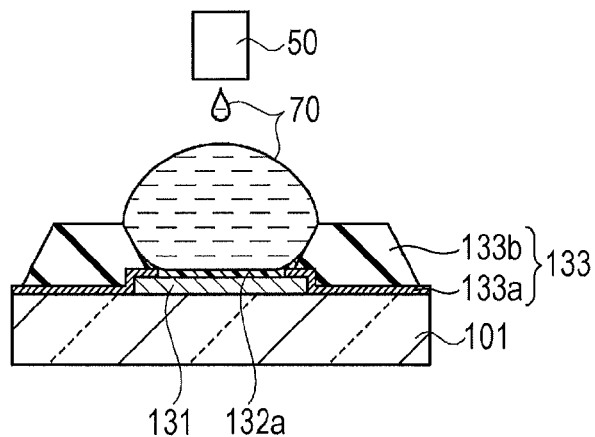
Figure 6E:
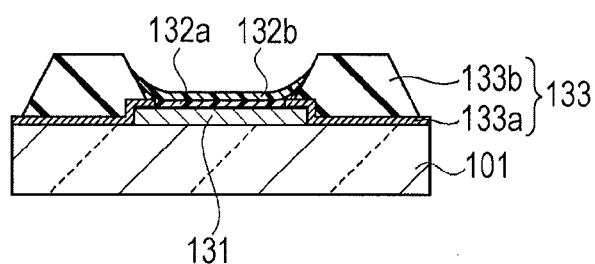

In Step S3 in FIG. 5, the hole transport layer 132b is formed by the liquid phase process. Specifically, firstly, a mixture including the hole transport material which is the low molecular material and the high molecular material is dispersed in the poor solvent. Then, the good solvent is added to the poor solvent in which the mixture is dispersed and then stirred, and the mixture is dissolved in a mixed solvent of the poor solvent and the good solvent. In doing so, an ink for forming a functional layer 70 in which the mixture is dissolved is discharged to the film forming region from a nozzle of the ink jet head 50, as shown in FIG. 6D. The ink for forming a functional layer 70 with the predetermined amount discharged as a droplet is raised by the interfacial surface tension in the film forming region surrounded by the barrier wall 133. By heating and drying the element substrate 101 on which the ink for forming a functional layer 70 is applied, for example, under a nitrogen atmosphere, the hole transport layer 132b is formed on the hole injection layer 132a, as shown in FIG. 6E. Since the ink for forming a functional layer 70 in which the mixture including the hole transport material which is the low molecular material and the high molecular material is dissolved is used, the gelation of the mixture is suppressed. In addition, even if the viscosity of the ink for forming a functional layer 70 increases in a heating and drying process of the ink for forming a functional layer 70 and the surface of the hole injection layer 132a including the high molecular material does not exhibit lyophilicity with respect to the ink for forming a functional layer 70, the hole transport layer 132b is formed without unevenness in the film forming region. Then, processing goes to Step S4.

Moreover, as a poor solvent in which the mixture is dispersed, a linear alkane-based solvent such as nonane, decane, undecane, or dodecane, an aliphatic alcohol-based solvent such as hexanol, heptanol, octanol, nonyl alcohol, or decyl alcohol, an aliphatic ether-based solvent such as dibutyl ether, dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, or tetraethylene glycol dimethyl ether, and an aromatic hydrocarbon-based solvent such as 1,3-diisopropylbenzene, 1,4-diisopropylbenzene, triisopropylbenzene, pentylbenzene, hexylbenzene, heptylbenzene, octylbenzene, or nonylbenzene are included.

In addition, as a good solvent capable of dissolving 0.1 g/L or more of the mixture, 3-phenoxy toluene, 2-isopropyl naphthalene, dibenzyl ether, isopropyl biphenyl, and bis dimethyl phenyl ethane are included. Moreover, the good solvent capable of being mixed with the poor solvent in which the mixture has been dispersed is selected from among the good solvents described above. It is more preferable that the good solvent be capable of dissolving 20 g/L or more of the mixture. In addition, the volume proportion (the volume ratio) of the poor solvent is preferably in a range from 10% to 70% with respect to the total volume of the poor solvent and the good solvent in view of rapidly performing the dissolution of the mixture. In addition, in order to stably discharge the ink for forming a functional layer 70 from a nozzle of the ink jet head 50 as a droplet, the viscosity of the ink for forming a functional layer 70 is preferably lower than 20 cp and more preferably 10 cp or lower. In addition, it is preferable that the boiling point (bp) of the poor solvent be 150° C. or higher and the boiling point (bp) of the good solvent be 250° C. or higher, from the viewpoint of preventing the clogging of the nozzle due to the drying of the ink for forming a functional layer 70. Furthermore, it is preferable that the boiling point (bp) of the poor solvent and the good solvent be 300° C. or lower in consideration of drying properties of the ink for forming a functional layer 70 applied in the film forming region.

Figure 7A:
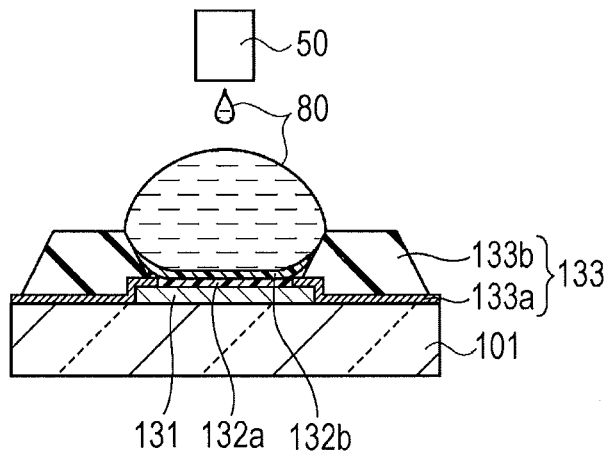
FIGS. 7A to 7C are schematic cross-sectional views showing a method of manufacturing an organic EL element.
Figure 7B:
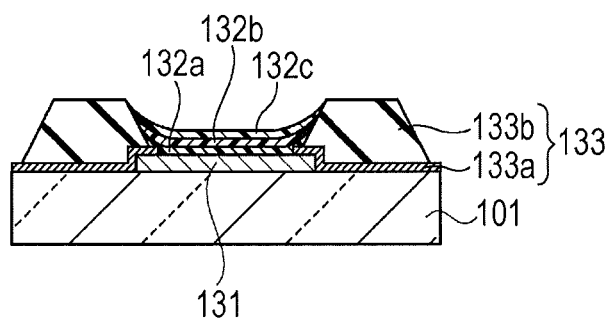

In Step S4 in FIG. 5, the luminescence layer 132c is formed by the liquid phase process. Specifically, firstly, an ink for forming a functional layer 80 including the luminescence layer forming material described above and, for example, cyclohexylbenzene as a solvent is discharged to the film forming region from a nozzle of the ink jet head 50, as shown in FIG. 7A. The ink for forming a functional layer 80 with the predetermined amount discharged as a liquid droplet is raised by the interfacial surface tension in the film forming region surrounded by the barrier wall 133. As a method of drying the applied ink for forming a functional layer 80, it is preferable to use a decompression drying method capable of relatively uniformly drying a solvent component, compared to general heating and drying. The ink for forming a functional layer 80 is evenly applied with the predetermined amount in the film forming region. Therefore, the luminescence layer 132c formed after drying has a substantially constant film thickness and a stable film shape (cross sectional shape) in the film forming region, as shown in FIG. 7B. Then, processing goes from Step S5 to Step S7.

Figure 7C:
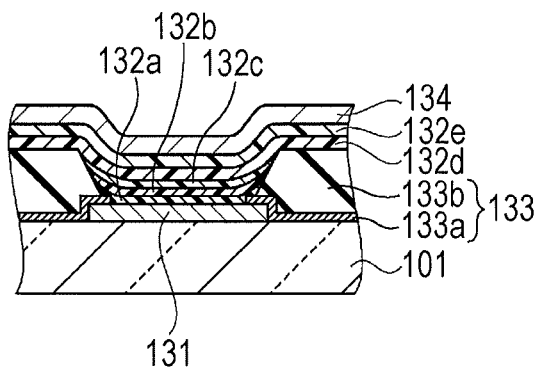

In Step S5 to Step S7 in FIG. 5, the electron transport layer 132d, the electron injection layer 132e, and the counter electrode 134 as a cathode are formed by the vapor phase process. Specifically, the films are sequentially formed using the materials of each layer described above, for example, by a vacuum deposition method and each layer is formed by laminating, as shown in FIG. 7C. In particular, it is preferable to form the counter electrode 134 by a vacuum deposition method in terms of being able to prevent a damage by heat of the functional layer 132. In addition, in order to prevent a decrease in luminescence function or luminescent lifetime of the functional layer 132 due to water or a gas such as oxygen entering into the functional layer 132 from outside, the film may be formed using an inorganic material such as, for example, an oxide or a nitride of silicon or an oxynitride of silicon having gas barrier properties so as to cover the surface of the counter electrode 134. Thereby, the organic EL element 130 is produced.

An effect of the embodiment described above is as follow.

(1) According to the organic EL element 130 and the method of manufacturing the same, among the functional layers 132, the hole injection layer 132a, the hole transport layer 132b, and the luminescence layer 132c are formed by the liquid phase process (the liquid droplet discharging method; the ink jet method), and the electron transport layer 132d and the electron injection layer 132e are formed by the vapor phase process (the vacuum deposition method). Therefore, since the liquid phase process is used for the layer such as the luminescence layer 132c which is required to be separately applied, it is possible to effectively manufacture the organic EL element 130, compared to a case of forming all of each of the thin film layers included in the functional layer 132 by using the vapor phase process.

(2) In addition, the hole transport layer 132b which is formed on the hole injection layer 132a is formed using the ink for forming a functional layer 70 in which a mixture including the hole transport material which is the low molecular material and the high molecular material is dispersed in the poor solvent, afterward, the good solvent is added thereto and then stirred, and the mixture is sufficiently dissolved in a mixed solvent including the poor solvent and the good solvent. Therefore, even if the gelation of the mixture of the low molecular material and the high molecular material is suppressed, the viscosity of the ink for forming a functional layer 70 increases in a heating and drying process of the ink for forming a functional layer 70, and the surface of the hole injection layer 132a including the high molecular material does not exhibit lyophilicity with respect to the ink for forming a functional layer 70, the hole transport layer 132b can be formed without unevenness. Therefore, the organic EL element 130 provided with such a functional layer 132 can realize the desired luminescent efficiency and luminescent lifetime.

(3) As to the ink for forming a functional layer 70, a mixture in which the low molecular material (the hole transport material) and the high molecular material are mixed is firstly dispersed in the poor solvent, afterward, the good solvent is added thereto. As a good solvent, one capable of being mixed with the poor solvent is selected, and the volume proportion of the poor solvent in the mixed solvent is in a range from 10% to 70%. Therefore, it is possible to suppress the gelation of the mixture of the low molecular material and the high molecular material in the mixed solvent and rapidly dissolve the mixture in a state dispersing in the poor solvent, in the mixed solvent. That is, it is possible to effectively manufacture the organic EL element 130 in productivity.

(4) By providing with the organic EL element 130 on the luminescence pixel 107, the organic EL apparatus 100 in which both excellent display quality (luminescence characteristics) and reliability quality (luminescent lifetime) can be achieved can be provided.

In the method of manufacturing the organic EL element 130 of the embodiment, the hole transport layer 132b is formed using the ink for forming a functional layer 70 in which the mixture including the low molecular material and the high molecular material is dissolved, however, the hole injection layer 132a and the luminescence layer 132c can also be formed using the ink for forming a functional layer in which the mixture including the low molecular material and the high molecular material is dissolved.

As a low molecular material used for forming the hole injection layer 132a, 4,4,N,N'-dipheylcarbazole, N,N'-bis(3-methylphenyl)-N,N'-bis(phenyl)benzidine, and the like are included. Similarly, as a high molecular material used for forming the hole injection layer 132a, polyvinylcarbazole, poly[N,N'-bis(4-butylphenyl)-N,N'-bis(phenyl)-benzidine], and the like are included. Moreover, as to a combination of the low molecular material and the high molecular material, it is preferable to be a combination of the low molecular material and the high molecular material mutually having the same basic skeleton.

As a low molecular material used for forming the luminescence layer 132c in which the luminescence of red color is obtained, iridium(III)bis(2-(2'-benzothienyl)pridinato-N, C3')(acetylacetonate) is included. Similarly, as a high molecular material used for forming the luminescence layer 132c in which the luminescence of red color is obtained, poly[{9,9-dihexyl-2,7-bis(1-cyanovinylene)fluorenylene}-alt-co-{2,5-bis(N,N'-diphenylamino)-1,4-phenylene}] is included.

As a low molecular material used for forming the luminescence layer 132c in which the luminescence of green color is obtained, Alq3 (tris(8-hydroxyquinolato)aluminium (III)) is included. Similarly, as a high molecular material used for forming the luminescence layer 132c in which the luminescence of green color is obtained, poly[(9,9-dioctyl-fluorenyl-2,7-diyl)-co-(N,N'-diphenyl)-N,N'-di(p-butylphenyl)-1,4-diaminobenzene)] is included.

As a low molecular material used for forming the luminescence layer 132c in which the luminescence of blue color is obtained, iridium(III)bis(2-(4,6-diflurophenyl)pyridinato-N,C2')picolinate is included. Similarly, as a high molecular material used for forming the luminescence layer 132c in which the luminescence of blue color is obtained, poly(9,9-dihexylfluorenyl-2,7-diyl)-End capped with is included.

Next, description will be given of an effect in the method of manufacturing the ink for forming a functional layer by giving more specific Examples of the ink for forming a functional layer in which the mixture including the low molecular material and the high molecular material is dissolved.

FIG. 8 is a table showing an evaluation result of a configuration and a dissolution time of an ink for forming a hole injection layer of Example 1, FIG. 9 is a table showing an evaluation result of a configuration and a dissolution time of an ink for forming a hole injection layer of Example 2, FIG. 10 is a table showing an evaluation result of a configuration and a dissolution time of an ink for forming a hole injection layer of Example 3, and FIG. 11 is a table showing an evaluation result of a configuration and a dissolution time of an ink for forming a hole injection layer of Example 4.

FIG. 12 is a table showing an evaluation result of a configuration and a dissolution time of an ink for forming a hole transport layer of Example 5, FIG. 13 is a table showing an evaluation result of a configuration and a dissolution time of an ink for forming a hole transport layer of Example 6, FIG. 14 is a table showing an evaluation result of a configuration and a dissolution time of an ink for forming a hole transport layer of Example 7, and FIG. 15 is a table showing an evaluation result of a configuration and a dissolution time of an ink for forming a hole transport layer of Example 8.

FIG. 16 is a table showing an evaluation result of a configuration and a dissolution time of an ink for forming a luminescence layer of Example 9, FIG. 17 is a table showing an evaluation result of a configuration and a dissolution time of an ink for forming a luminescence layer of Example 10, FIG. 18 is a table showing an evaluation result of a configuration and a dissolution time of an ink for forming a luminescence layer of Example 11, and FIG. 19 is a table showing an evaluation result of a configuration and a dissolution time of an ink for forming a luminescence layer of Example 12.

Moreover, as to the evaluation of a dissolution time of a mixture including the low molecular material and the high molecular material in a mixed solution in each Example, the dissolution time of the mixture in Comparative Example in which the mixture is dissolved only in the good solvent of Example is set to "1" and the dissolution time is digitalized by comparing.

Example 1

As to the ink for forming the hole injection layer of Example 1 as an ink for forming a functional layer, a mixture of N,N'-bis(3-methylphenyl)-N,N'-bis(phenyl)benzidine which is the low molecular material and poly[N,N'-bis(4-butylphenyl)-N,N'-bis(phenyl)-benzidine] which is the high molecular material was dispersed in 10 L (liter) of the poor solvent, afterward, 90 L (liter) of the good solvent was added thereto and then stirred, and the dissolution time in a mixed solvent (100 L) was measured. In addition, the weight ratio to the mixed solvent of the mixture is set to 5 wt %. That is, the time taken from adding the good solvent until completely dissolving the mixture which is equivalent to 5 wt % in the mixed solvent was measured.

As a poor solvent of Example 1, thirty-one kinds made up of four kinds of linear alkane-based solvents (nonane, decane, undecane, and dodecane), five kinds of aliphatic alcohol-based solvents (hexanol, heptanol, octanol, nonyl alcohol, and decyl alcohol), fourteen kinds of aliphatic ether-based solvents (dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, and tetraethylene glycol dimethyl ether), and eight kinds of aromatic hydrocarbon-based solvents (1,3-diisopropylbenzene, 1,4-diisopropylbenzene, triisopropylbenzene, pentylbenzene, hexylbenzene, heptylbenzene, octylbenzene, and nonylbenzene) were used. As a good solvent combining with these poor solvents, 3-phenoxy toluene having a boiling point (bp) of 272° C. was used. That is, Example 1 shows the dissolution time of the mixture in thirty-one kinds of mixed solvents.

As shown in FIG. 8, according to the method of manufacturing the ink for forming a hole injection layer of Example 1, it was possible to dissolve the mixture in the mixed solvent with a time of 0.1 (1/10) or less, compared to Comparative Example (an index 1.0 of the dissolution time). The dissolution times vary depending on the selection of the poor solvents and are largely in the order of the linear alkane-based solvent=the aliphatic alcohol-based solvent>the aliphatic ether-based solvent>the aromatic hydrocarbon-based solvent. Specifically, in a case of using the linear alkane-based solvent or the aliphatic alcohol-based solvent, it was possible to shorten the dissolution time to 0.02 (1/50) with respect to Comparative Example (1.0). In a case of using the aliphatic ether-based solvent, it was possible to shorten the dissolution time to largely 0.06. In a case of using the aromatic hydrocarbon-based solvent, it was possible to shorten the dissolution time to 0.1 (1/10) or less. In a case of selecting triisopropylbenzen or nonylbenzene among the aromatic hydrocarbon-based solvents, same dissolution time as that of a case of selecting the linear alkane-based solvent or the aliphatic alcohol-based solvent can be obtained.

As to the inks for forming a hole injection layer of Example 2 to Example 4 as an ink for, forming a functional layer, the volume proportion (the volume ratio) of the poor solvent in the mixed solvent and the good solvent are made different with respect to Example 1 and other constituent elements and the method of manufacturing are the same as those of Example 1. Specifically, the contents are as follow.

Example 2

The ink for forming a hole injection layer of Example 2 configures 100 L of the mixed solvent by mixing 30 L of the poor solvent and 70 L of the good solvent. That is, while the volume proportion of the poor solvent in the mixed solvent of Example 1 is 10%, that of Example 2 is 30%. In addition, as a good solvent, 2-isopropyl naphthalene having a boiling point (bp) of 268° C. was used.

Example 3

The ink for forming a hole injection layer of Example 3 configures 100 L of the mixed solvent by mixing 50 L of the poor solvent and 50 L of the good solvent. That is, the volume proportion of the poor solvent in the mixed solvent is 50%. In addition, as a good solvent, dibenzyl ether having a boiling point (bp) of 298° C. was used.

Example 4

The ink for forming a hole injection layer of Example 4 configures 100 L of the mixed solvent by mixing 70 L of the poor solvent and 30 L of the good solvent. That is, the volume proportion of the poor solvent in the mixed solvent is 70%. In addition, as a good solvent, isopropyl biphenyl having a boiling point (bp) of 291° C. was used.

As shown in FIG. 9, FIG. 10, and FIG. 11, according to the method of manufacturing the inks for forming a hole injection layer of Example 2 to Example 4, it was possible to dissolve the mixture in the mixed solvent with a time of 1/10 or less, compared to Comparative Example in the same way as Example 1. In addition, the trend of the dissolution time due to the selection of the poor solvent is also the same as that of Example 1.

Example 5

As to the ink for forming a hole transport layer of Example 5 as an ink for forming a functional layer, a mixture of 4,4',4''-tris(N,N'-phenyl-3-methylphenylamino)triphenylamine which is the low molecular material and poly[(9,9-dioctylfluorenyl-2,7-diyl)-co-(4,4'-(N-(4-sec-butylphenyl))diphenylamine)] which is the high molecular material was dispersed in 10 L (liter) of the poor solvent, afterward, 90 L (liter) of the good solvent was added thereto and then stirred, and the dissolution time in the mixed solvent (100 L) was measured. In addition, the weight ratio to the mixed solvent of the mixture is set to 5 wt %. That is, the time taken from adding the good solvent until completely dissolving the mixture which is equivalent to 5 wt % in the mixed solvent was measured. The poor solvent was selected from the same thirty-one kinds as those of Example 1 and as a good solvent, 3-phenoxytoluene having a boiling point (bp) of 272° C. was used.

As shown in FIG. 12, according to the method of manufacturing the ink for forming a hole transport layer of Example 5, it was possible to shorten the dissolution time of the mixture in the mixed solvent by 20% or more, compared to Comparative Example (an index 1.0 of the dissolution time). Specifically, the dissolution times vary depending on the selection of the poor solvents, and in a case of using the linear alkane-based solvent or the aliphatic alcohol-based solvent, it was possible to shorten the dissolution time to 0.02 (1/50) with respect to Comparative Example. In a case of using the aliphatic ether-based solvent, it was possible to shorten the dissolution time to largely 0.1 (1/10) or less. In a case of using the aromatic hydrocarbon-based solvent, it was possible to shorten the dissolution time to approximately 0.8 (4/5) to 0.1 (1/10). In a case of selecting triisopropylbenzen among the aromatic hydrocarbon-based solvents, almost the same dissolution time as that of a case of selecting the linear alkane-based solvent or the aliphatic alcohol-based solvent can be obtained.

As to the inks for forming a hole transport layer of Example 6 to Example 8 as an ink for forming a functional layer, the volume proportion (the volume ratio) of the poor solvent in the mixed solvent and the good solvent are made different with respect to Example 5 and other constituent elements and the method of manufacturing are the same as those of Example 5. Specifically, the contents are as follow.

Example 6

The ink for forming a hole transport layer of Example 6 configures 100 L of the mixed solvent by mixing 30 L of the poor solvent and 70 L of the good solvent. That is, while the volume proportion of the poor solvent in the mixed solvent of Example 5 is 10%, that of Example 6 is 30%. In addition, as a good solvent, 2-isopropyl naphthalene having a boiling point (bp) of 268° C. was used.

Example 7

The ink for forming a hole transport layer of Example 7 configures 100 L of the mixed solvent by mixing 50 L of the poor solvent and 50 L of the good solvent. That is, the volume proportion of the poor solvent in the mixed solvent is 50%. In addition, as a good solvent, dibenzyl ether having a boiling point (bp) of 298° C. was used.

Example 8

The ink for forming a hole transport layer of Example 8 configures 100 L of the mixed solvent by mixing 70 L of the poor solvent and 30 L of the good solvent. That is, the volume proportion of the poor solvent in the mixed solvent is 70%. In addition, as a good solvent, isopropyl biphenyl having a boiling point (bp) of 291° C. was used.

As shown in FIG. 13, FIG. 14, and FIG. 15, according to the method of manufacturing the inks for forming a hole transport layer of Example 6 to Example 8, it was possible to shorten the dissolution time of the mixture in the mixed solvent to approximately 0.02 to 0.8, with respect to Comparative Example (1.0) in the same way as Example 5. In addition, the degree of the shortening of the dissolution time in accordance with the kind of the poor solvent is also the same as that of Example 5.

Example 9

As to the ink for forming a luminescence layer of Example 9 as an ink for forming a functional layer, a mixture of tris(8-hydroxyquinolato)aluminium(III) which is the low molecular material and poly[(9,9-dioctylfluorenyl-2,7-diyl)-co-(N,N'-diphenyl)-N,N'-di(p-butylphenyl)-1,4-diamino-benzene] which is the high molecular material was dispersed in 10 L (liter) of the poor solvent, afterward, 90 L (liter) of the good solvent was added thereto and then stirred, and the dissolution time in the mixed solvent (100 L) was measured. In addition, the weight ratio to the mixed solvent of the mixture is set to 5 wt %. That is, the time taken from adding the good solvent until completely dissolving the mixture which is equivalent to 5 wt % in the mixed solvent was measured. The poor solvent was selected from the same thirty-one kinds as those of Example 1 and as a good solvent, 3-phenoxytoluene having a boiling point (bp) of 272° C. was used.

As shown in FIG. 16, according to the method of manufacturing the ink for forming a luminescence layer of Example 9, it was possible to shorten the dissolution time of the mixture in the mixed solvent by 20% or more, compared to Comparative Example (an index 1.0 of the dissolution time). Specifically, the dissolution times vary depending on the selection of the poor solvents, and in a case of using the linear alkane-based solvent or the aliphatic alcohol-based solvent, it was possible to shorten the dissolution time to 0.02 (1/50) with respect to Comparative Example (1.0). In a case of using the aliphatic ether-based solvent, it was possible to shorten the dissolution time to largely 0.04 to 0.2 (⅕). In a case of using the aromatic hydrocarbon-based solvent, it was possible to shorten the dissolution time to approximately 0.1 to 0.8. In a case of selecting triisopropylbenzen among the aromatic hydrocarbon-based solvents, almost the same dissolution time as that of a case of selecting the linear alkane-based solvent or the aliphatic alcohol-based solvent can be obtained.

As to the inks for forming a luminescence layer of Example 10 to Example 12 as an ink for forming a functional layer, the volume proportion (the volume ratio) of the poor solvent in the mixed solvent and the good solvent are made different with respect to Example 9 and other constituent elements and the method of manufacturing are the same as those of Example 9. Specifically, the contents are as follow.

Example 10

The ink for forming a luminescence layer of Example 10 configures 100 L of the mixed solvent by mixing 30 L of the poor solvent and 70 L of the good solvent. That is, while the volume proportion of the poor solvent in the mixed solvent of Example 9 is 10%, that of Example 10 is 30%. In addition, as a good solvent, 2-isopropyl naphthalene having a boiling point (bp) of 268° C. was used.

Example 11

The ink for forming a luminescence layer of Example 11 configures 100 L of the mixed solvent by mixing 50 L of the poor solvent and 50 L of the good solvent. That is, the volume proportion of the poor solvent in the mixed solvent is 50%. In addition, as a good solvent, dibenzyl ether having a boiling point (bp) of 298° C. was used.

Example 12

The ink for forming a luminescence layer of Example 12 configures 100 L of the mixed solvent by mixing 70 L of the poor solvent and 30 L of the good solvent. That is, the volume proportion of the poor solvent in the mixed solvent is 70%. In addition, as a good solvent, isopropyl biphenyl having a boiling point (bp) of 291° C. was used.

As shown in FIG. 17, FIG. 18, and FIG. 19, according to the method of manufacturing the inks for forming a luminescence layer of Example 10 to Example 12, it was possible to shorten the dissolution time of the mixture in the mixed solvent to approximately 0.02 to 0.8, with respect to Comparative Example (1.0) in the same way as Example 9. In addition, the degree of the shortening of the dissolution time in accordance with the kind of the poor solvent is also the same as that of Example 9.

Moreover, even in a case where 4,4',N,N'-diphenylcarbazole was used as a low molecular material and polyvinylcarbazole was used as a high molecular material in the ink for forming a hole injection layer described above, the same evaluation results were obtained as those of Example 1 to Example 4.

In addition, even in a case where iridium(III)bis (2-(2'-benzothienyl)pyridinato-N,C3) (acetylacetonate) was used as a low molecular material and poly[{9,9-dihexyl-2,7-bis (1-cyanovinylene)fluorenylene}-alt-co-{2,5-bis(N,N'-diphenylamino)-1,4-phenylene}] was used as a high molecular material, or iridium(III)bis(2-(4,6-difluorophenyl)pyridinato-N,C2')picolinate was used as a low molecular material and poly(9,9-dihexylfluorenyl-2,7-diyl) was used as a high molecular material, in the ink for forming a luminescence layer described above, the same evaluation results were obtained as those of Example 9 to Example 12.

Furthermore, when the volume proportion (volume ratio) of the poor solvent in the mixed solvent was set to a value which exceeded 70%, for example, 90% in each of the ink forming a hole injection layer, the ink forming a hole transport layer, and the ink forming a luminescence layer, since the volume proportion of the good solvent decreased, it was difficult to sufficiently dissolve 5 wt % mixture, and thus the gelation of the mixture occurred and each ink was suspended.

The summary of the evaluation results of Example 1 to Example 12 is as follow.

A mixture including the low molecular material and the high molecular material in the poor solvent is firstly dispersed, afterward, the good solvent is added thereto, then in order to shorten the dissolution time of the mixture in a mixed solvent than Comparative Example (an index 1.0 of the dissolution time), it is preferable to set the volume proportion (the volume ratio) of the poor solvent from 10% to 70%.

In addition, in a case of selecting the good solvent from among 3-phenoxy toluene, 2-isopropyl naphthalene, dibenzyl ether, and isopropyl biphenyl, regardless of the selection of the low molecular material and the high molecular material in each of the hole injection layer, the hole transport layer, and the luminescence layer, it is preferable to select the linear alkane-based solvent or the aliphatic alcohol-based solvent, or triisopropylbenzen as a poor solvent. Thereby, it is possible to shorten the dissolution time of the mixture in the mixed solvent by approximately 1/50 with respect to Comparative Example.

In addition, in a case of selecting the poor solvent from among the aromatic hydrocarbon-based solvents, regardless of the selection of the low molecular material and the high molecular material in each of the hole injection layer, the hole transport layer, and the luminescence layer, it is possible to set the boiling point (bp) of the poor solvent to 200° C. or higher, therefore, in a case of using the liquid droplet discharging method (the ink jet method), it is possible to produce more suitable ink for forming a functional layer.

Moreover, in Example 1 to Example 12, the content of the mixture included in the mixed solvent is set to 5 wt %, however, is not limited thereto. The content may be set corresponding to the solubility of the mixture per unit volume in the mixed solvent.

The invention is not limited to the embodiment described above and can be appropriately changed in a range which is not contrary to the gist or the idea of the invention understood from the scope of claims and the entire specification, and a method of manufacturing an organic EL element, a method of manufacturing an ink for forming a functional layer, an organic EL element manufactured by using a method of manufacturing an organic EL element, and an organic EL apparatus to which the organic EL element is applied, in accordance with such changes, are also included in a technical scope of the invention. Various Modification Examples are considered in addition to the embodiment described above. Hereinafter, description will be given with Modification Examples.

Modification Example 1

The poor solvent and the good solvent are not limited to the solvents used in Examples described above and other derivatives can be applied.

As a specific example, a halogenated solvent, a hydrocarbon solvent, an aromatic hydrocarbon solvent, an ether solvent, an alcohol solvent, a ketone solvent, a nitrile solvent, a sulfoxide solvent, and an amide solvent are included. These organic solvents may be used in combination of two or more kinds thereof.

As a specific example of the halogenated solvent, carbon tetrachloride, methylene chloride, chloroform, dichloroethane, tetrachloroethylene, chlorobenzene, bis(2-chloroethyl) ether, chloromethyl ethyl ether, chloromethyl methyl ether, 2-chloroethyl ethyl ether, and 2-chloroethyl methyl ether are included.

As a specific example of the hydrocarbon solvent, pentane, hexane, cyclohexane, heptane, octane, decahydronaphthalene, petroleum ether, ligroin, and bicyclohexyl are included.

As a specific example of the aromatic hydrocarbon solvent, benzene, toluene, xylene, ethylbenzene, cumene, pseudocumene, mesitylene, butylbenzene, tetramethylbenzene, tert-butylbenzene, hexylbenzene, heptylbenzene, octylbenzene, nonylbenzene, decamethylbenzene, tetralin, cyclohexylbenzene, decalin, and methylnaphthalene are included.

As a specific example of the ether solvent, diethyl ether, ethyl propyl ether, dipropyl ether, diisopropyl ether, dibutyl ether, methyl tert-butyl ether, anisole, methyl anisole, diphenyl ether, phenoxytoluene, phenoxy xylene, ditolylether, tetrahydrofuran, dihydrofuran, dioxane, tetrahydropyran, 4-methyl-1,3-dioxane, and 4-phenyl-1,3-dioxane are included.

As a specific example of the alcohol solvent, methanol, ethanol, 1-propanol, 2-propanol, 1-butanol, 2-butanol, 2-methyl-1-propanol, 2-methyl-2-propanol, 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethyl butanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methyl cyclohexanol, 3-methyl cyclohexanol, and 4-methyl cyclohexanol are included.

As a specific example of the ketone solvent, acetone, methyl ethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, and benzylacetone are included.

As a specific example of the nitrile solvent, acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, and 3-n-butoxypropionitrile are included.

As a specific example of the sulfoxide solvent, dimethyl sulfoxide, di-n-butyl sulfoxide, tetramethylene sulfoxide, and methyl phenyl sulfoxide are included.

As a specific example of the amide solvent, dimethylformamide, dimethylacetamide, acylamido, 2-acetamide ethanol, N,N-dimethyl-m-toluamide, trifluoroacetamide, N,N-dimethylacetamide, N,N-diethyldodecanamide, epsilon-caprolactam, N,N-diethyl acetamide, N-tert-butyl formamide, formamide, pivalamide, N-butyramide, N,N-dimethylacetoacetamide, N-methylformamide, N,N-diethylformamide, N-formyl ethylamine, acetamide, N,N-diisopropyl formamide, 1-formylpiperidine, and N-methylformanilide are included.

Moreover, for the poor solvent and the good solvent, it is preferable to select the solvents which are not separated when mixed and are easily mixed together.

Modification Example 2

The low molecular material and the high molecular material included in the hole injection layer, the hole transport layer, and the luminescence layer are not limited to the material used in Examples.

For example, as a hole injection layer forming material, polythiophene and a derivative thereof, polyaniline and a derivative thereof, polypyrrole and a derivative thereof, N,N,N',N'-tetraphenyl-p-diaminobenzene and a derivative thereof, and the like are included, and these can be used as one kind or in combination of two or more kinds thereof.

In addition, as a hole transport layer forming material, various kinds of p-type high molecular materials or various kind of p-type low molecular materials can be used alone or in combination thereof.

As a p-type high molecular material (an organic polymer), for example, one having an arylamine skeleton like polyarylamine such as poly(2,7-(9,9-di-n-octyl fluorene)-(1,4-phenylene-((4-sec-butylphenyl)imino)-1,4-phenylene (TFB), one having a fluorene skeleton like a fluorene-bithiophene copolymer, one having both an arylamine skeleton and a fluorene skeleton like a fluorene-arylamine copolymer, poly(N-vinylcarbazole), polyvinyl pyrene, polyvinyl anthracene, polythiophene, polyalkylthiophene, polyhexylthiophene, poly(p-phenylene vinylene), polythienylenevinylene, a pyrene formaldehyde resin, an ethylcarbazole formaldehyde resin or a derivative thereof, and the like are included.

Such a p-type high molecular material can also be used as a mixture with other compounds. As an example, poly(3,4-ethylenedioxythiophene/styrenesulfonate) (PEDOT/PSS) as a mixture containing polythiophene and the like are included.

On the other hand, as a p-type low molecular material, for example, an aryl cycloalkane-based compound like 1,1-bis (4-di-para-tolylaminophenyl)cyclohexane or 1,1'-bis(4-di-para-tolylaminophenyl)-4-phenyl-cyclohexane, arylamine-based compound like 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), or TPTE, a phenylenediamine-based compound like N,N,N',N'-tetraphenyl-p-phenylenediamine, N,N,N',N'-tetra(para-tolyl)-para-phenylenediamine, or N,N,N',N'-tetra(meth-tolyl)-meta-phenylenediamine (PDA), a carbazole-based compound like carbazole, N-isopropyl carbazole, or N-phenyl carbazole, a stilbene-based compound like stilbene or 4-di-para-tolyl aminostilbene, an oxazole-based compound like $O_xZ$, a triphenylmethane-based compound like triphenylmethane or m-MTDATA, a pyrazoline-based compound like 1-phenyl-3-(para-dimethylaminophenyl)pyrazoline, a benzine (cyclohexadiene)-based compound, a triazole-based compound like triazole, an imidazole-based compound like imidazole, an oxadiazole-based compound like 1,3,4-oxadiazole or 2,5-di(4-dimethyl aminophenyl)-1,3,4-oxadiazole, an anthracene-based compound like anthracene or 9-(4-diethylamino styryl)anthracene, a fluorenone-based compound like fluorenone, 2,4,7-trinitro-9-fluorenone, or 2,7-bis(2-hydroxy-3-(2-chlorophenylcarbamoyl)-1-naphthylazo)fluorenone, an aniline-based compound like polyaniline, a silane-based compound, a pyrrole-based compound like 1,4-dithioketo-3,6-diphenyl-pyrrolo-(3,4-c)-pyrrolopyrrole, a Flowlen-based compound like Flowlen, a porphyrin-based compound like porphyrin or metal tetraphenylporphyrin, a quinacridone-based compound like quinacridone, a metal or metal-free phthalocyanine-based compound like phthalocyanine, copper phthalocyanine, tetra(t-butyl) copper phthalocyanine, or iron phthalocyanine, a metal or metal-free naphthalocyanine-based compound like copper naphthalocyanine, vanadyl naphthalocyanine, or monochlorogallium naphthalocyanine, a benzidine-based compound like N,N'-di(naphthalen-1-yl)-N,N'-diphenyl-benzidine or N,N,N',N'-tetraphenyl benzidine, and the like are included.

In addition, a luminescence material (hereinafter, called a red luminescence material) in which the luminescence of red color is obtained is not particularly limited and various kinds of fluorescent materials and phosphorescent materials in which the luminescence of red color is obtained can be used as one kind or in combination of two or more kinds thereof.

The fluorescent material is not particularly limited as long as the fluorescent material emits fluorescence of red color and, for example, a perylene derivative, a europium complex, a benzopyran derivative, rhodamine derivative, a benzothioxanthene derivative, a porphyrin derivative, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylamino styryl)-4H-pyran (DCM), poly[2-methoxy-5-(2-ethylhexyloxy)-1,4-(1-cyano vinylene phenylene)], poly[{9,9-dihexyl-2,7-bis(1-cyanovinylene)fluorenylene}ortho-co-{2,5-bis(N,N'-diphenylamino)-1,4-phenylene}], poly[{2-methoxy-5-(2-ethylhexyloxy)-1,4-(1-cyano vinylene phenylene)}-co-{2,5-bis(N,N'-diphenylamino)-1,4-phenylene}], and the like are included.

The phosphorescent material is not particularly limited as long as the phosphorescent material emits phosphorescence of red color, a metal complex such as, for example, iridium, ruthenium, platinum, osmium, rhenium, or palladium is included, and one in which at least one among ligands of these metal complexes has a phenyl pyridine skeleton, a bipyridyl skeleton, a porphyrin skeleton, or the like is also included. More specifically, tris(1-phenylisoquinoline) iridium, bis[2-(2'-benzo[4,5-α]thienyl)pyridinate-N,C3'] iridium(acetylacetonate) (btp2Ir (acac)), 2,3,7,8,12,13,17,18-octaethyl-12H,23H-porphyrin-platinum(II), bis[2-(2'-benzo[4,5-α]thienyl)pyridinate-N,C3']iridium, and bis(2-phenylpyridine)iridium(acetylacetonates) are included.

In addition, a host material in which the red luminescence material is added as a guest material may be included in addition to the red luminescence material described above.

The host material generates excitons by recombining the holes and the electrons and has a function of exciting the red luminescence material by transferring energy of the excitons to the red luminescence material (Forster transfer or Dexter transfer). In a case of using such a host material, for example, it is possible to use the host material by setting the red luminescence material which is the guest material to a dopant and doping the red luminescence material in the host material.

Such a host material is not particularly limited as long as the function as described above exhibits with respect to the used red luminescence material, however, in a case where the red luminescence material includes the red fluorescent material, for example, a naphthacene derivative, a naphthalene derivative, an acene derivative (an acene-based material) like an anthracene derivative, a distyrylarylene derivative, a perylene derivative, a distyrylbenzene derivative, a distyrylamine derivative, a quinolinolate-based metal complex such as tris(8-quinolinolato)aluminum complex (Alq3), a triarylamine derivative such as a tetramer of triphenylamine, an oxadiazole derivative, a silole derivative, a dicarbazole derivative, an oligothiophene derivative, a benzopyran derivative, a triazole derivative, a benzoxazole derivative, a benzothiazole derivative, a quinoline derivative, 4,4'-bis(2,2'-diphenyl vinyl)biphenyl (DPVBi), and the like are included and these can also be used as one kind or in combination of two or more kinds thereof.

In a case of using the red luminescence material (the guest material) as described above and the host material, the content (the doping amount) of the red luminescence material in a red luminescence layer is preferably from 0.01 wt % to 10 wt % and more preferably from 0.1 wt % to 5 wt %. By setting the content of the red luminescence material within such a range, it is possible to optimize the luminescent efficiency.

In addition, a luminescence material (hereinafter, called a green luminescence material) in which the luminescence of green color is obtained is not particularly limited, for example, various kinds of fluorescent materials and phosphorescent materials in which the luminescence of green color is obtained are included, and these can be used as one kind or in combination of two or more kinds thereof.

The fluorescent material is not particularly limited as long as the fluorescent material emits fluorescence of green color and, for example, a coumarin derivative, quinacridone and a derivative thereof, 9,10-bis[(9-ethyl-3-carbazole)-vinylenyl]-anthracene, poly(9,9-dihexyl-2,7-vinylene fluorenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-ortho-co-(2-methoxy-5-(2-ethoxylhexyloxy)-1,4-phenylene)], and the like are included.

The phosphorescent material is not particularly limited as long as the phosphorescent material emits phosphorescence of green color, a metal complex such as, for example, iridium, ruthenium, platinum, osmium, rhenium, or palladium is included, and, specifically, fac-tris(2-phenylpyridine)iridium (Ir(ppy)3), bis(2-phenylpyridinate-N,C2') iridium(acetylacetonate), fac-tris[5-fluoro-2-(5-trifluoromethyl-2-pyridine)phenyl-C,N]iridium, and the like are included.

In addition, in a green luminescence layer 9, a host material in which the green luminescence material is added as a guest material may be included in addition to the green luminescence material described above.

As such a host material, the same one as the host material described in a section of the red luminescence layer described above can be used.

In addition, as a luminescence material (hereinafter, called a blue luminescence material) in which the luminescence of blue color is obtained, for example, various kinds of fluorescent materials and phosphorescent materials in which the luminescence of blue color is obtained are included and these can be use as one kind or in combination of two or more kinds thereof.

The fluorescent material is not particularly limited as long as the fluorescent material emits fluorescence of blue color and, for example, a distyrylamine derivative such as a distyryldiamine-base compound, a fluoranthene derivative, a pyrene derivative, perylene and a perylene derivative, an anthracene derivative, a benzoxazole derivative, a benzothiazole derivative, a benzimidazole derivative, a chrysene derivative, a phenanthrene derivative, a distyrylbenzene derivative, tetraphenyl butadiene, 4,4'-bis(9-ethyl-3-carbazovinylene)-1,1'-biphenyl (BCzVBi), poly[(9,9-dioctylfluoren-2,7-diyl)-co-(2,5-dimethoxybenzen-1,4-diyl)], poly[(9,9-dihexyloxyfluoren-2,7-diyl)-ortho-co-(2-methoxy-5-{2-ethoxy hexyloxy}phenylen-1,4-diyl)], poly[(9,9-dioctylfluorene-2,7-diyl)-co-(ethylnylbenzene)], and the like are included.

The phosphorescent material is not particularly limited as long as the phosphorescent material emits phosphorescence of blue color, a metal complex such as, for example, iridium, ruthenium, platinum, osmium, rhenium, or palladium is included, and, specifically, bis[4,6-difluorophenyl pyridinate-N,C2']-picolinate-iridium, tris[2-(2,4-difluorophenyl) pyridinate-N,C2']iridium, bis[2-(3,5-trifluoromethyl)pyridinate-N,C2']-picolinate-iridium, bis(4,6-difluorophenyl pyridinate-N,C2')iridium(acetylacetonate), and the like are included.

In addition, in a blue luminescence layer, a host material in which the blue luminescence material is added as a guest material may be included in addition to the blue luminescence material described above.

As such a host material, the same one as the host material described in a section of the red luminescence layer described above can be used.

Modification Example 3

The ink for forming a functional layer is not limited only to include the mixture in which the low molecular material and the high molecular material are mixed as a solid content. Even if the solid content is the low molecular material or the high molecular material, the invention can be applied.

Modification Example 4

The organic EL apparatus 100 provided with the organic EL element 130 to which the invention is applied is not limited only to use as a display apparatus. For example, the organic EL apparatus 100 can be applied to a lighting apparatus, an electronic light control glass, an exposure apparatus (a printer head) which exposes a photoreceptor, or the like.

The entire disclosure of Japanese Patent Application No. 2013-181894, filed Nov. 3, 2013 is expressly incorporated by reference herein.

What is claimed is:
1. A method of manufacturing an ink for forming a functional layer which is used when a functional layer having a luminescence function is formed, comprising:
dispersing a solid content of any of a first material having a molecular weight of 10,000 or less, a second material having a weight average molecular weight of 10,000 or more, or a mixture in which the first material and the second material are mixed, in a first solvent; and
dissolving the solid content by adding a second solvent to the first solvent in which the solid content is dispersed to form a mixture of the first solvent, the second solvent, and the solid content, the solid content having a higher solubility in the second solvent than in the first solvent;

wherein a volume ratio of the first solvent is from 10% to 70% with respect to a total volume of the mixture of the first solvent, the second solvent, and the solid content.

2. The method of manufacturing an ink for forming a functional layer according to claim 1, wherein a boiling point of the first solvent is from 150° C. to 300° C. and a boiling point of the second solvent is from 250° C. to 300° C.

3. The method of manufacturing an ink for forming a functional layer according to claim 1, wherein the first solvent is at least one of: a linear alkane-based solvent, an aliphatic alcohol-based solvent, an aliphatic ether-based solvent, and an aromatic hydrocarbon-based solvent, and the second solvent is at least one of: 3-phenoxy toluene, 2-isopropyl naphthalene, dibenzyl ether, and isopropyl biphenyl.

4. The method of manufacturing an ink for forming a functional layer according to claim 1, wherein the first solvent is at least one of: a linear alkane-based solvent and an aliphatic alcohol-based solvent, and the second solvent is at least one of: 3-phenoxy toluene, 2-isopropyl naphthalene, dibenzyl ether, and isopropyl biphenyl.

5. The method of manufacturing an ink for forming a functional layer according to claim 1, wherein the first solvent is at least one of: four kinds of linear alkane-based solvents (nonane, decane, undecane, and dodecane), five kinds of aliphatic alcohol-based solvents (hexanol, heptanol, octanol, nonyl alcohol, and decyl alcohol), fourteen kinds of aliphatic ether-based solvents (dipentyl ether, diethylene glycol dimethyl ether, diethylene glycol ethyl methyl ether, diethylene glycol isopropyl methyl ether, diethylene glycol diethyl ether, diethylene glycol butyl methyl ether, diethylene glycol dibutyl ether, dipropylene glycol dimethyl ether, dipropylene glycol methyl propyl ether, triethylene glycol dimethyl ether, triethylene glycol ethyl methyl ether, triethylene glycol butyl methyl ether, tripropylene glycol dimethyl ether, and tetraethylene glycol dimethyl ether), and eight kinds of aromatic hydrocarbon-based solvents (1,3-diisopropylbenzene, 1,4-diisopropylbenzene, triisopropylbenzene, pentylbenzene, hexylbenzene, heptylbenzene, octylbenzene, and nonylbenzene), and the second solvent is at least one of: 3-phenoxy toluene, 2-isopropyl naphthalene, dibenzyl ether, and isopropyl biphenyl.

6. A method of manufacturing an organic EL element provided with a functional layer having a luminescence function between an anode and a cathode, wherein the functional layer includes a hole injection layer, a hole transport layer, and a luminescence layer, laminated from the anode side in order, and the method comprises forming at least one layer among the hole injection layer, the hole transport layer, and the luminescence layer using an ink for forming a functional layer manufactured using the method according to claim 1.

7. A method of manufacturing an organic EL element provided with a functional layer having a luminescence function between an anode and a cathode, wherein the functional layer includes a hole injection layer, a hole transport layer, and a luminescence layer, laminated from the anode side in order, and the method comprises forming at least one layer among the hole injection layer, the hole transport layer, and the luminescence layer using an ink for forming a functional layer manufactured using the method according to claim 2.

8. The method of manufacturing an organic EL element according to claim 6, wherein, in the forming of the functional layer, the hole injection layer is formed using the ink for forming a functional layer.

9. The method of manufacturing an organic EL element according to claim 7, wherein, in the forming of the functional layer, the hole injection layer is formed using the ink for forming a functional layer.

10. The method of manufacturing an organic EL element according to claim 6, wherein, in the forming of the functional layer, the hole transport layer is formed using the ink for forming a functional layer.

11. The method of manufacturing an organic EL element according to claim 7, wherein, in the forming of the functional layer, the hole transport layer is formed using the ink for forming a functional layer.

12. The method of manufacturing an organic EL element according to claim 6, wherein, in the forming of the functional layer, the luminescence layer is formed using the ink for forming a functional layer.

13. The method of manufacturing an organic EL element according to claim 7, wherein, in the forming of the functional layer, the luminescence layer is formed using the ink for forming a functional layer.

* * * * *